United States Patent
Park et al.

(10) Patent No.: US 10,084,051 B2
(45) Date of Patent: Sep. 25, 2018

(54) SEMICONDUCTOR DEVICES INCLUDING FIELD EFFECT TRANSISTORS AND METHODS OF FABRICATING THE SAME

(71) Applicant: SAMSUNG ELECTRONICS CO., LTD., Suwon-si, Gyeonggi-do (KR)

(72) Inventors: Sangjine Park, Yongin-si (KR); Jae-Hwan Lee, Seoul (KR); Yongsun Ko, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 2 days.

(21) Appl. No.: 15/133,424

(22) Filed: Apr. 20, 2016

(65) Prior Publication Data
US 2016/0343819 A1  Nov. 24, 2016

(30) Foreign Application Priority Data

May 22, 2015 (KR) .................. 10-2015-0072039

(51) Int. Cl.
| H01L 29/78 | (2006.01) |
| H01L 29/423 | (2006.01) |
| H01L 29/06 | (2006.01) |
| H01L 29/08 | (2006.01) |
| H01L 29/66 | (2006.01) |

(52) U.S. Cl.
CPC .... H01L 29/42356 (2013.01); H01L 29/0649 (2013.01); H01L 29/0847 (2013.01); H01L 29/66545 (2013.01); H01L 29/66795 (2013.01); H01L 29/785 (2013.01); H01L 29/7848 (2013.01)

(58) Field of Classification Search
None
See application file for complete search history.

(56) References Cited

U.S. PATENT DOCUMENTS

| 7,297,600 | B2 | 11/2007 | Oh et al. |
| 7,314,802 | B2 | 1/2008 | Zhu et al. |
| 7,696,048 | B2 | 4/2010 | Kwon et al. |
| 8,174,073 | B2 | 5/2012 | Lee et al. |
| 8,426,923 | B2* | 4/2013 | Lee ................. H01L 21/823431 257/365 |
| 8,697,523 | B2 | 4/2014 | Cai et al. |
| 8,729,634 | B2 | 5/2014 | Shen et al. |
| 8,884,370 | B2 | 11/2014 | Chang et al. |
| 8,895,383 | B2* | 11/2014 | Lee ................. H01L 21/823431 438/222 |

(Continued)

FOREIGN PATENT DOCUMENTS

| KR | 10-2005-0090126 A | 9/2005 |
| KR | 10-2014-0143841 A | 12/2014 |

*Primary Examiner* — Abul Kalam
(74) *Attorney, Agent, or Firm* — Lee & Morse, P.C.

(57) ABSTRACT

A semiconductor device includes a fin structure on a substrate, device isolation patterns on the substrate at opposite sides of the fin structure, a gate electrode intersecting the fin structure and the device isolation patterns, a gate dielectric pattern between the gate electrode and the fin structure and between the gate electrode and the device isolation patterns, and gate spacers on opposite sidewalls of the gate electrode, wherein, on each of the device isolation patterns, a bottom surface of the gate dielectric pattern is at a higher level than bottom surfaces of the gate spacers.

20 Claims, 25 Drawing Sheets

(56) References Cited

U.S. PATENT DOCUMENTS

| | | |
|---|---|---|
| 9,087,723 B2 * | 7/2015 | Lee .................. H01L 27/092 |
| 9,287,387 B2 * | 3/2016 | Fumitake ............ H01L 29/6681 |
| 9,577,075 B2 * | 2/2017 | Choi ................ H01L 29/66803 |
| 9,660,082 B2 * | 5/2017 | Chang ................ H01L 29/165 |
| 2009/0206405 A1 | 8/2009 | Doyle et al. |
| 2013/0221447 A1 * | 8/2013 | Lee .................. H01L 27/092 |
| | | 257/369 |
| 2013/0230958 A1 * | 9/2013 | Lee ................ H01L 21/823431 |
| | | 438/283 |
| 2014/0103455 A1 | 4/2014 | Ando et al. |
| 2014/0291737 A1 | 10/2014 | Hafez et al. |
| 2014/0361338 A1 | 12/2014 | Kerber et al. |
| 2016/0284806 A1 * | 9/2016 | Park ................ H01L 29/41791 |
| 2016/0322495 A1 * | 11/2016 | Moon ................ H01L 29/7848 |
| 2016/0359021 A1 * | 12/2016 | Kim ................ H01L 29/66795 |
| 2017/0154991 A1 * | 6/2017 | Ko .................. H01L 29/785 |

* cited by examiner

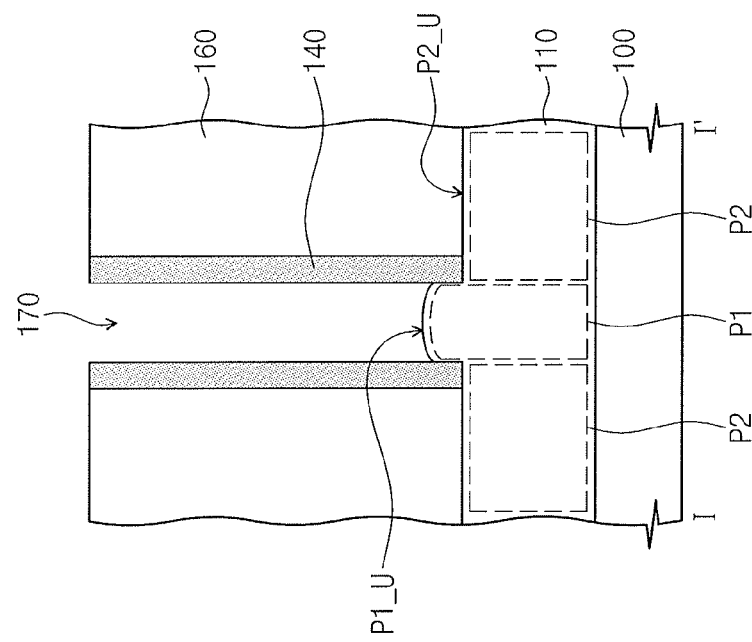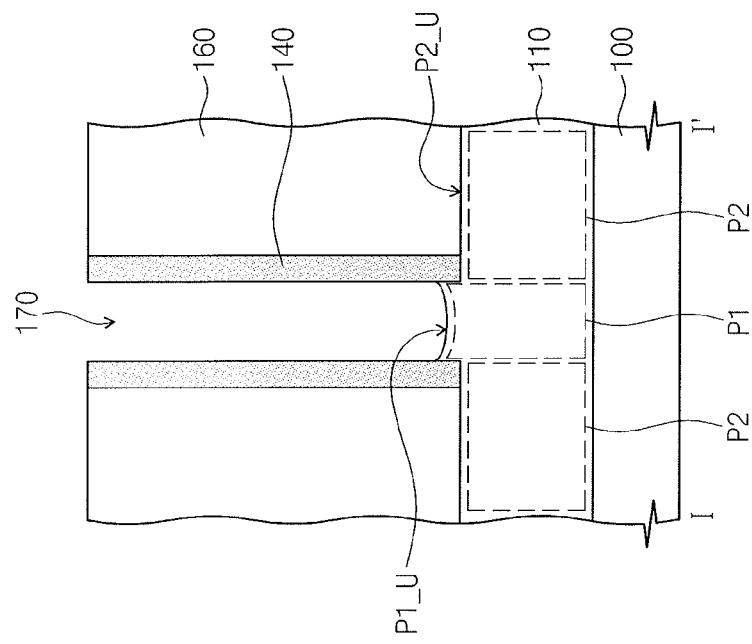

3000

4000

SEMICONDUCTOR DEVICES INCLUDING FIELD EFFECT TRANSISTORS AND METHODS OF FABRICATING THE SAME

CROSS-REFERENCE TO RELATED APPLICATION

Korean Patent Application No. 10-2015-0072039, filed on May 22, 2015, in the Korean Intellectual Property Office, and entitled: "Semiconductor Devices Including Field Effect Transistors and Methods of Fabricating the Same," is incorporated by reference herein in its entirety.

BACKGROUND

1. Field

Embodiments relate to semiconductor devices and methods of fabricating the same. More particularly, embodiments relate to semiconductor devices including fin field effect transistors and methods of fabricating the same.

2. Description of the Related Art

A semiconductor device includes an integrated circuit including metal-oxide-semiconductor field effect transistors (MOSFETs). As sizes and design rules of semiconductor devices have been reduced, sizes of the MOSFETs have also been reduced. Operating characteristics of semiconductor devices may be deteriorated by the size reduction of the MOSFETs. Thus, various researches are being conducted for semiconductor devices capable of overcoming limitations caused by a high integration density of a semiconductor device and of improving performance.

SUMMARY

Embodiments may provide semiconductor devices capable of improving electrical characteristics and methods of fabricating the same.

Embodiments may also provide semiconductor devices capable of improving reliability and methods of fabricating the same.

In one aspect, a semiconductor device may include a fin structure on a substrate, device isolation patterns on the substrate at opposite sides of the fin structure, a gate electrode intersecting the fin structure and the device isolation patterns, a gate dielectric pattern between the gate electrode and the fin structure and between the gate electrode and the device isolation patterns, and gate spacers on opposite sidewalls of the gate electrode, wherein, on each of the device isolation patterns, a bottom surface of the gate dielectric pattern is at a higher level than bottom surfaces of the gate spacers.

In an embodiment, the gate electrode and the gate dielectric pattern may be defined as a gate structure. Each of the device isolation patterns may include a first portion disposed under the gate structure, and second portions disposed at both sides of the gate structure, respectively. A top surface of the first portion may be disposed at a higher level than top surfaces of the second portions.

In an embodiment, at least a portion of the first portion may be disposed between the gate spacers.

In an embodiment, the bottom surface of the gate dielectric pattern may be in contact with the top surface of the first portion, and the bottom surfaces of the gate spacers may be in contact with the top surfaces of the second portions, respectively.

In an embodiment, the gate dielectric pattern may extend into between the gate electrode and the gate spacers.

In an embodiment, the topmost surface of the fin structure may be disposed at a higher level than the topmost surface of each of the device isolation patterns.

In an embodiment, the fin structure may include a third portion disposed under the gate structure and the gate spacers, and fourth portions provided at both sides of the gate structure so as to be laterally spaced apart from each other with the third portion interposed therebetween. A top surface of the third portion may be disposed at a higher level than top surfaces of the fourth portions, and the top surface of the first portion may be disposed at a lower level than the top surface of the third portion.

In an embodiment, the semiconductor device may further include source/drain regions at both sides of the gate structure. The source/drain regions may be provided on the fourth portions of the fin structure, respectively.

In an embodiment, the top surface of the first portion may have a concave shape or a convex shape.

In an embodiment, the top surfaces of the second portions may have a concave shape or a convex shape.

In another aspect, a semiconductor device may include a fin structure on a substrate, device isolation patterns disposed on the substrate at both sides of the fin structure, respectively, a gate electrode intersecting the fin structure and the device isolation patterns, and gate spacers disposed on both sidewalls of the gate electrode, respectively. At least a portion of each of the device isolation patterns may be disposed between the gate spacers.

In an embodiment, the semiconductor device may further include a gate dielectric pattern disposed between the gate electrode and the fin structure, the gate dielectric pattern extending into between the gate electrode and each of the device isolation patterns. The gate electrode and the gate dielectric pattern may be defined as a gate structure. Each of the device isolation patterns may include a first portion disposed under the gate structure, and second portions disposed at both sides of the gate structure, respectively. A top surface of the first portion may be disposed at a higher level than top surfaces of the second portions.

In an embodiment, a bottom surface of the gate dielectric pattern may be in contact with the top surface of the first portion.

In an embodiment, the gate dielectric pattern may extend into between the gate electrode and the gate spacers.

In an embodiment, bottom surfaces of the gate spacers may be in contact with the top surfaces of the second portions, respectively.

In an embodiment, the fin structure may include a third portion disposed under the gate structure and the gate spacers, and fourth portions provided at both sides of the gate structure so as to be laterally spaced apart from each other with the third portion interposed therebetween. A top surface of the third portion may be disposed at a higher level than top surfaces of the fourth portions, and the top surface of the first portion may be disposed at a lower level than the top surface of the third portion.

In an embodiment, the semiconductor device may further include source/drain regions at both sides of the gate structure. The source/drain regions may be provided on the fourth portions of the fin structure, respectively.

In still another aspect, a method of fabricating a semiconductor device may include forming a fin structure on a substrate, forming device isolation patterns at both sides of the fin structure, respectively, forming a sacrificial gate pattern intersecting the fin structure and the device isolation patterns, recessing upper portions of the device isolation patterns disposed at both sides of the sacrificial gate pattern, forming gate spacers on both sidewalls of the sacrificial gate pattern, respectively, forming a gap region between the gate spacers by removing the sacrificial gate pattern, and forming a gate electrode in the gap region.

In an embodiment, forming the device isolation patterns may include forming an insulating layer on the substrate having the fin structure; and etching the insulating layer until sidewalls of the fin structure are exposed. The fin structure may include an upper region exposed by the device isolation patterns.

In an embodiment, the method may further include forming an etch stop pattern disposed between the sacrificial gate pattern and the fin structure and between the sacrificial gate pattern and each of the device isolation patterns before recessing the upper portions of the device isolation patterns disposed at both sides of the sacrificial gate pattern. The etch stop pattern may be disposed between the gate spacers.

In an embodiment, each of the device isolation patterns may include a first portion disposed under the sacrificial gate pattern, and second portions disposed at both sides of the sacrificial gate pattern, respectively. A top surface of the first portion may be disposed at a higher level than top surfaces of the second portions by recessing the upper portions of the device isolation patterns.

In an embodiment, at least a portion of the first portion may be disposed between the gate spacers before forming the gap region.

In an embodiment, the etch stop pattern may be disposed between the sacrificial gate pattern and the first portion before forming the gap region.

In an embodiment, forming the gap region may include removing the etch stop pattern disposed between the gate spacers to expose the fin structure. An upper portion of the first portion may be disposed between the gate spacers after removing the etch stop pattern.

In an embodiment, bottom surfaces of the gate spacers may be in contact with the top surfaces of the second portions, respectively.

In yet another aspect, a semiconductor device may include a fin structure on a substrate, device isolation patterns on the substrate at opposite sides of the fin structure, a gate electrode intersecting the fin structure and the device isolation patterns, and gate spacers on opposite sidewalls of the gate electrode, a first portion of each of the device isolation patterns protrudes toward the gate electrode and separates between the gate spacers.

In an embodiment, the gate spacers may extend beyond the opposite sidewalls of the gate electrode toward the substrate.

In an embodiment, the gate spacers may overlap the sidewalls of the gate electrode and sidewalls of the first portion of each of the device isolation patterns.

In an embodiment, each device isolation pattern may include the first portion only in a region overlapping the gate electrode, and second portion at opposite sides of the first portion, the first portion extending above the second portions into a space between the gate spacers.

In an embodiment, a distance between a bottom of the gate electrode and a bottom of the substrate is larger than a distance between bottoms of the gate spacers and the bottom of the substrate.

BRIEF DESCRIPTION OF THE DRAWINGS

Features will become apparent to those of ordinary skill in the art by describing in detail exemplary embodiments with reference to the attached drawings, in which:

FIGS. 12A and 12B illustrate cross-sectional views corresponding to line I-I' of FIG. 9 to illustrate methods of fabricating a semiconductor device according to some embodiments.

DETAILED DESCRIPTION

Figure 1:
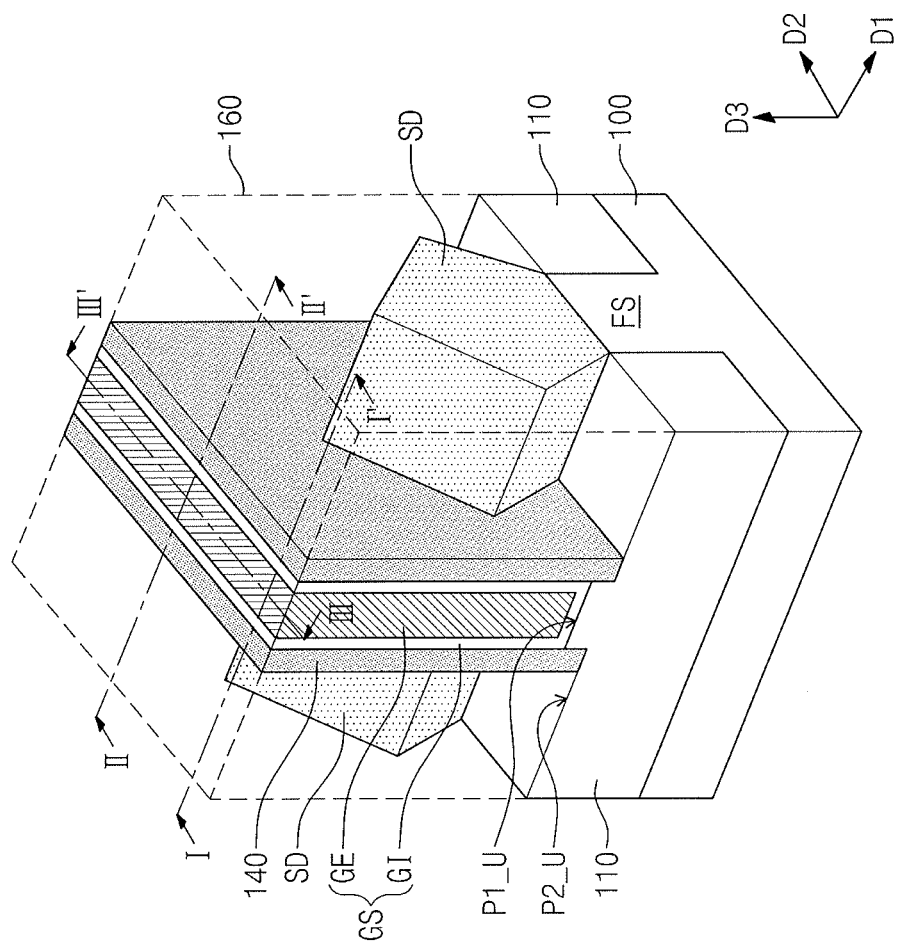
FIG. 1 illustrates a perspective view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the specification, it will be understood that when an element such as a layer, region or substrate is referred to as being "on" another element, it can be directly on the other element or intervening elements may be present. Additionally, in the drawings, the thicknesses of elements may be exaggerated for clarity. The same reference numerals or the same reference designators denote the same elements throughout the specification. As used herein, the term "and/or" includes any and all combinations of one or more of the associated listed items.

The embodiments in the detailed description will be described with cross-sectional, perspective and/or plan views as ideal exemplary views. Accordingly, shapes of the exemplary views may be modified according to fabricating or manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting. It will be also understood that although the terms first, second, third etc. may be used herein to describe various elements, these elements should not be limited by these terms. These terms are only used to distinguish one element from another element. Exemplary embodiments herein include their complementary counterparts.

The terminology used herein is for the purpose of describing particular embodiments only and is not intended to limit. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, embodiments will be fully described with reference to the accompanying drawings.

Figure 2:
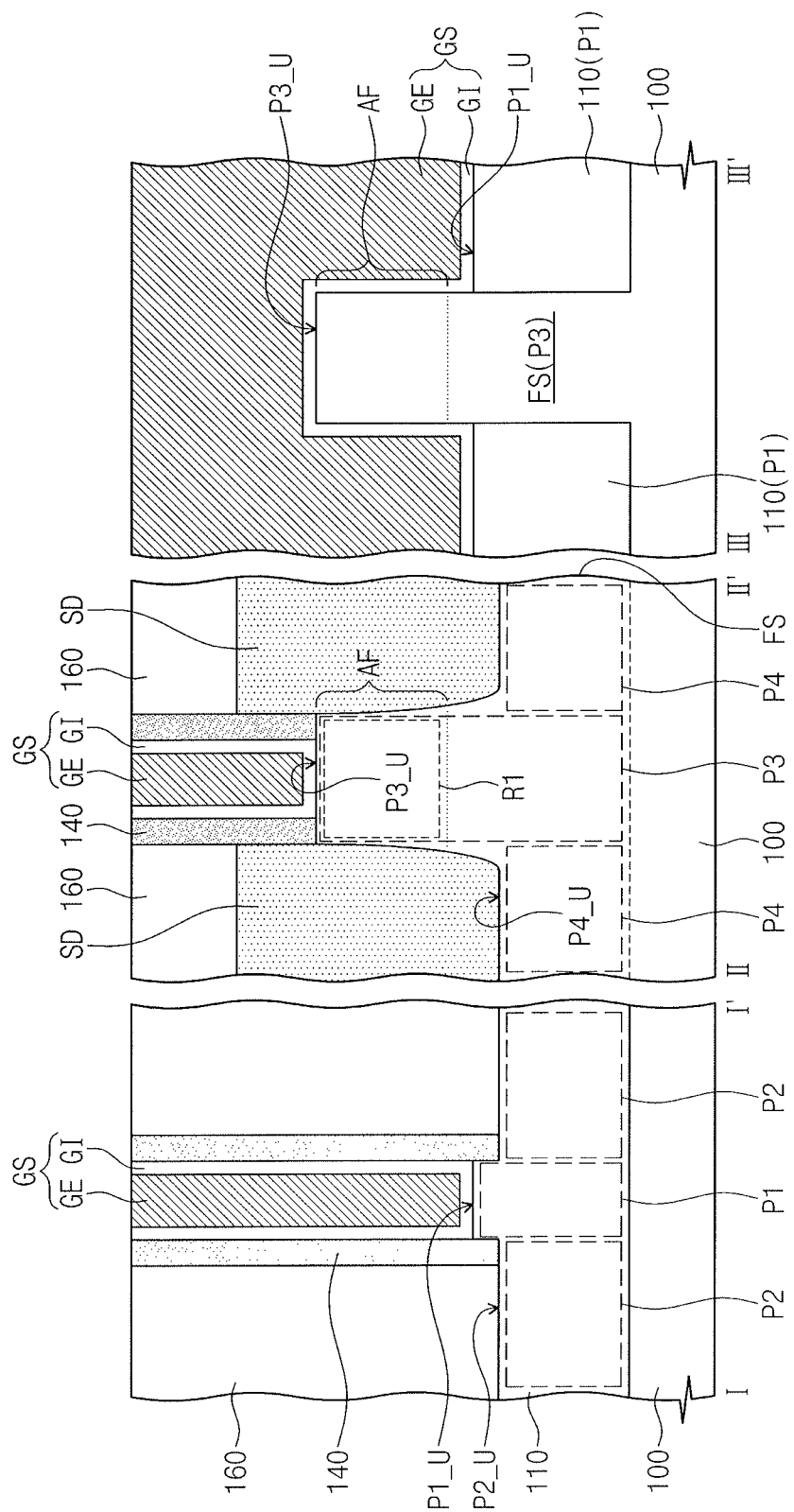
FIG. 2 illustrates a cross-sectional view taken along lines I-I', II-II', and III-III' of FIG. 1.

FIG. 1 is a perspective view illustrating a semiconductor device according to an embodiment, and FIG. 2 is a cross-sectional view taken along lines I-I', II-II', and III-III' of FIG. 1.

Referring to FIGS. 1 and 2, a fin structure FS may be provided on a substrate 100. The substrate 100 may be a semiconductor substrate. For example, the substrate 100 may be a silicon substrate or a silicon-on-insulator (SOI) substrate. The fin structure FS may extend in a first direction D1. A second direction D2 may intersect the first direction D1. The fin structure FS may protrude from the substrate 100 in a third direction D3 perpendicular to the first and second directions D1 and D2. The first and second directions D1 and D2 may be parallel to a top surface of the substrate 100. According to an embodiment, the fin structure FS may correspond to an active pattern formed by patterning the substrate 100.

Device isolation patterns 110 may be provided at both sides of the fin structure FS. The device isolation patterns 110 may be provided on the substrate 100 to extend in the first direction D1 and may be spaced apart from each other with the fin structure FS interposed therebetween. The device isolation patterns 110 may include an oxide (e.g., silicon oxide), a nitride (e.g., silicon nitride), and/or an oxynitride (e.g., silicon oxynitride). The device isolation patterns 110 may expose an upper portion of the fin structure FS. Each of the device isolation patterns 110 may expose a portion of a sidewall of the fin structure FS. In other word, the fin structure FS may have the sidewalls exposed by the device isolation patterns 110.

A gate structure GS may be provided on the substrate 100 to intersect the fin structure FS and the device isolation patterns 110. The gate structure GS may extend in the second direction D2. The gate structure GS may include a gate electrode GE extending in the second direction D2, and a gate dielectric pattern GI disposed between the gate electrode GE and the fin structure FS. The gate dielectric pattern GI may extend, e.g., continuously, between the gate electrode GE and each of the device isolation patterns 110. Gate spacers 140 may be provided on both, e.g., opposite, sidewalls of the gate structure GS, respectively. The gate dielectric pattern GI may further extend, e.g., continuously, between the gate electrode GE and the gate spacers 140. For example, as illustrated in FIG. 1, the gate dielectric pattern GI may cover continuously the sidewalls and bottom of the gate electrode GE, and the gate spacers 140 may be on the sidewalls of the gate electrode GE to have portions, e.g., only, on the device isolation patterns 110 that extend beyond the bottoms of the gate electrode GE and the gate dielectric pattern GI toward the substrate 100.

The gate electrode GE may include at least one of a conductive metal nitride (e.g., titanium nitride or tantalum nitride) or a metal (e.g., aluminum or tungsten). The gate dielectric pattern GI may include at least one of high-k dielectric layers. For example, the gate dielectric pattern GI may include at least one of hafnium oxide, hafnium silicate, zirconium oxide, or zirconium silicate. The gate spacers 140 may include a nitride (e.g., silicon nitride).

Each of the device isolation patterns 110 may include a first portion P1 disposed under the gate structure GS, and second portions P2 disposed at both sides of the gate structure GS. A top surface P1_U of the first portion P1 may be disposed at a higher level along the third direction D3 relative to the substrate 100 than top surfaces P2_U of the second portions P2, e.g., the top surface P1_U of the first portion P1 may protrude above the top surfaces P2_U of the second portions P2 relative to the substrate 100. At least a portion of the first portion P1 may be disposed between the gate spacers 140, e.g., at least a portion of the first portion P1 may be between bottoms of the gate spacers 140 to separate therebetween along the first direction D1. A bottom surface of the gate dielectric pattern GI may be in contact with the top surface P1_U of the first portion P1, and bottom surfaces of the gate spacers 140 may be in contact with the top surfaces P2_U of the second portions P2, respectively. Thus, on each of the device isolation patterns 110, the bottom surface of the gate dielectric pattern GI may be disposed at a higher level along the third direction D3 relative to the substrate 100 than the bottom surfaces of the gate spacers 140.

The fin structure FS may include a third portion P3 disposed under the gate structure GS and the gate spacers 140, and fourth portions P4 disposed at both sides of the gate structure GS (FIG. 2). The fourth portions P4 may not overlap with the gate spacers 140 when viewed from a plan view. A top surface P3_U of the third portion P3 may be disposed at a higher level than top surfaces P4_U of the fourth portions P4.

The topmost surface of the fin structure FS may be disposed at a higher level than the topmost surface of each of the device isolation patterns 110. The topmost surface of the fin structure FS may correspond to the top surface P3_U of the third portion P3, and the topmost surface of each of the device isolation patterns 110 may correspond to the top surface P1_U of the first portion P1. In other words, the top surface P3_U of the third portion P3 of the fin structure FS may be disposed at a higher level than the top surface P1_U of the first portion P1 of each of the device isolation patterns 110.

In an embodiment, the top surfaces P4_U of the fourth portions P4 of the fin structure FS may be substantially coplanar with the top surfaces P2_U of the second portions P2 of each of the device isolation patterns 110, as illustrated in FIG. 2. However, embodiments are not limited thereto. In an embodiment, the top surfaces P4_U of the fourth portions P4 of the fin structure FS may be disposed at a higher level than the top surfaces P2_U of the second portions P2 of each of the device isolation patterns 110, unlike FIG. 2.

The fin structure FS may include an upper portion (hereinafter, referred to as 'an active fin AF') exposed by the device isolation patterns 110. The active fin AF may be an upper portion of the third portion P3 of the fin structure FS. The gate structure GS may cover a top surface and sidewalls of the active fin AF. The active fin AF may function as a channel of a transistor including the gate structure GS.

In detail, the third portion P3 of the fin structure FS may have sidewalls exposed by the device isolation patterns 110. The gate structure GS may cover the top surface P3_U and the exposed sidewalls of the third portion P3 and may extend onto the top surface P1_U of the first portion P1 of each of the device isolation patterns 110. The bottom surface of the gate dielectric pattern GI may be in contact with the top surface P3_U and the exposed sidewalls of the third portion P3 of the fin structure FS and may extend onto the first portion P1 of each of the device isolation patterns 110 so as to be in contact with the top surface P1_U of the first portion P1. The bottom surfaces of the gate spacers 140 may be in contact with the top surface P3_U and the exposed sidewalls of the third portion P3 of the fin structure FS and may extend onto the second portions P2 of each of the device isolation patterns 110 so as to be in contact with the top surfaces P2_U of the second portions P2, respectively. Thus, the bottom surface of the gate dielectric pattern GI disposed on the third portion P3 of the fin structure FS may be disposed at the substantially same level as the bottom surfaces of the gate spacers 140 disposed on the third portion P3 of the fin structure FS.

Source/drain regions SD may be provided on the fin structure FS at both sides of the gate structure GS, respectively. The source/drain regions SD may be disposed on the fourth portions P4 of the fin structure FS, respectively. The source/drain regions SD may be laterally spaced apart from each other with the active fin AF interposed therebetween. Bottom surfaces of the source/drain regions SD may be disposed at a lower level than the top surface of the active fin AF (i.e., the top surface P3_U of the third portion P3).

The source/drain regions SD may include epitaxial layers formed using the fin structure FS as a seed. For example, the source/drain regions SD may include at least one of silicon-germanium (SiGe), silicon (Si), or silicon carbide (SiC), which is epitaxially grown using the fin structure FS as a seed. In an embodiment, if the semiconductor device includes a complementary metal-oxide-semiconductor (CMOS) structure, a first epitaxial layer may be formed for a source/drain region of an N-type MOS field effect transistor (NMOSFET), and a second epitaxial layer may be formed for a source/drain region of a P-type MOSFET (PMOSFET). The first epitaxial layer may be configured to provide a tensile strain to a channel region (i.e., the active fin AF) of the NMOSFET, and the second epitaxial layer may be configured to provide a compressive strain to a channel region (i.e., the active fin AF) of the PMOSFET. The first epitaxial layer may be formed of silicon (Si) and/or silicon carbide (SiC), and the second epitaxial layer may be formed of silicon-germanium (SiGe). However, embodiments are not limited thereto.

The source/drain regions SD may further include dopants. The dopants may be provided to improve electrical characteristics of the transistor including the source/drain regions SD. If the transistor is the NMOSFET, the dopants may be, e.g., phosphorus (P). If the transistor is the PMOSFET, the dopants may be, e.g., boron (B).

If the gate electrode GE is formed by performing a replacement process using a sacrificial gate pattern, the sacrificial gate pattern may be removed to form a gap region between the gate spacers 140. An etching process for forming the gap region may be performed until the fin structure FS between the gate spacers 140 is exposed.

However, if the device isolation patterns 110 between the gate spacers 140 were to be over-etched by the etching process, loss of the device isolation patterns 110 could be increased, thereby causing a bottom surface of the gate electrode GE in the gap region to be lower than bottom surfaces of the gate spacers 140. In this case, an electrical short could be caused between the gate electrode GE and the source/drain regions SD adjacent thereto.

In contrast, according to embodiments, at least a portion of the device isolation pattern 110 may be disposed between the gate spacers 140 after the etching process for forming the gap region. Thus, the bottom surfaces of the gate electrode GE and the gate dielectric pattern GI may be higher than the bottom surfaces of the gate spacers 140. In other words, an electrical short between the gate electrode GE and the source/drain regions SD may be prevented by the device isolation patterns 110.

A lower interlayer insulating layer 160 may be provided on the substrate 100 to cover the gate structure GS and the source/drain regions SD. The lower interlayer insulating layer 160 may include at least one of, e.g., a silicon oxide layer, a silicon nitride layer, a silicon oxynitride layer, or low-k dielectric layers. An upper interlayer insulating layer may be provided on the lower interlayer insulating layer 160. The upper interlayer insulating layer may include an oxide (e.g., silicon oxide), a nitride (e.g., silicon nitride), and/or an oxynitride (e.g., silicon nitride). First contact plugs may penetrate the upper interlayer insulating layer and the lower interlayer insulating layer 160 so as to be electrically connected to the source/drain regions SD, and a second contact plug may penetrate the upper interlayer insulating layer and the lower interlayer insulating layer 160 so as to be electrically connected to the gate electrode GE. Interconnections may be disposed on the upper interlayer insulating layer so as to be connected to the first and second contact plugs. Operating voltages may be applied to the source/drain regions SD and the gate electrode GE through the interconnections and the first and second contact plugs. The first and second contact plugs and the interconnections may include conductive materials.

FIGS. 3, 5, 7, and 9 are perspective views illustrating stages in a method of fabricating a semiconductor device according to an embodiment. FIGS. 4, 6, 8, and 10 are cross-sectional views taken along lines I-I', II-II', and III-III' of FIGS. 3, 5, 7, and 9, respectively. FIGS. 11A and 11B are cross-sectional views corresponding to the line I-I' of FIG. 5 to illustrate methods of fabricating a semiconductor device. FIGS. 12A and 12B are cross-sectional views corresponding to the line I-I' of FIG. 9 to illustrate methods of fabricating a semiconductor device according to some embodiments.

Figure 3:
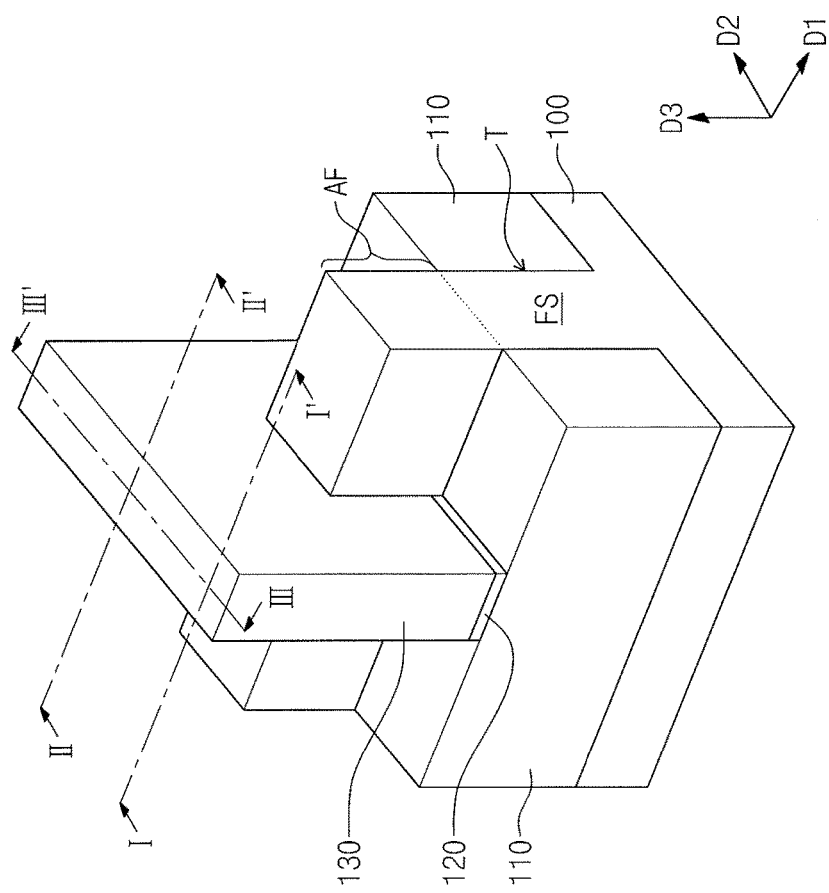
FIGS. 3, 5, 7, and 9 illustrate perspective views of a method of fabricating a semiconductor device according to an embodiment.
Figure 4:
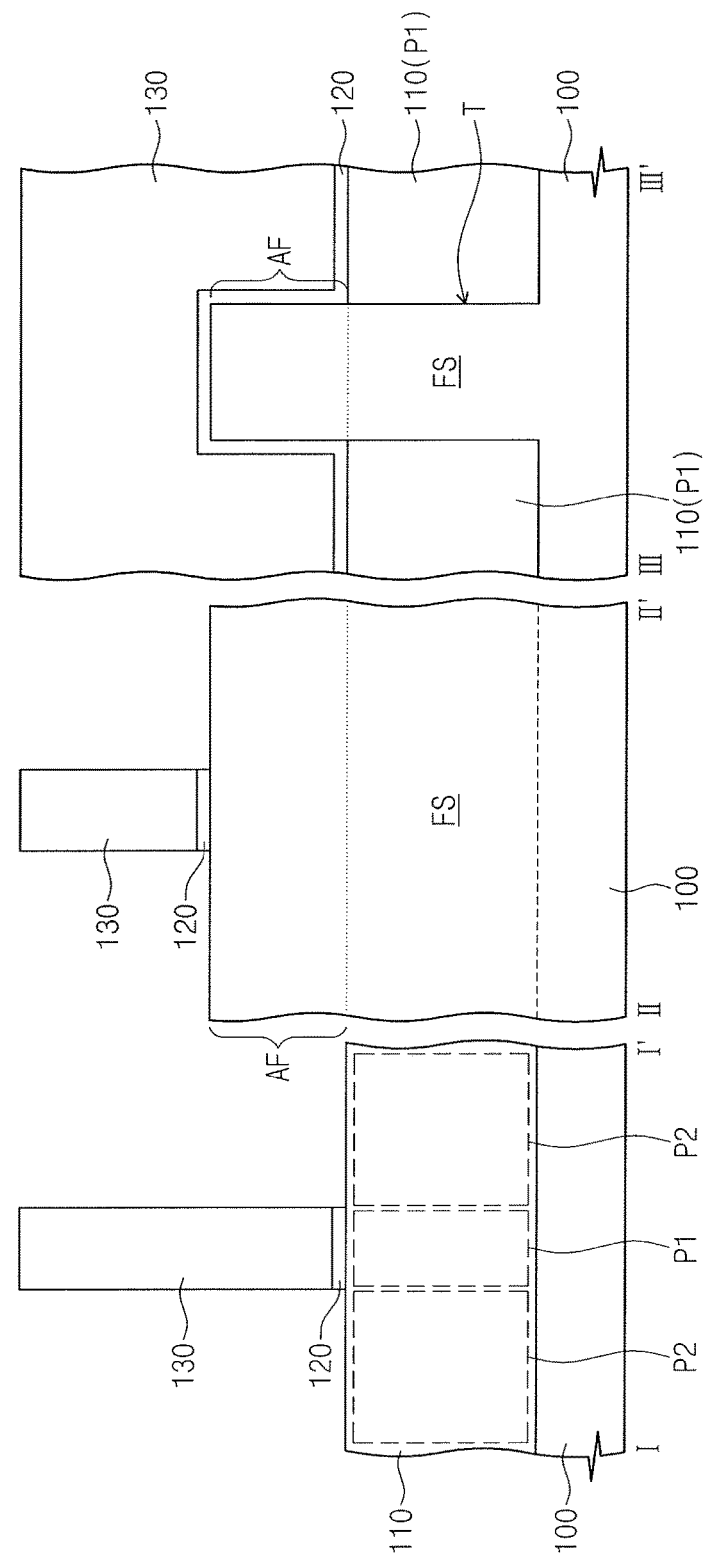
FIGS. 4, 6, 8, and 10 illustrate cross-sectional views taken along lines I-I', II-II', and III-III' of FIGS. 3, 5, 7, and 9, respectively.

Referring to FIGS. 3 and 4, the fin structure FS may be formed on the substrate 100. Forming the fin structure FS may include patterning the substrate 100 to form trenches T defining the fin structure FS. The trenches T may have linear shapes extending in the first direction D1 and may be spaced apart from each other in the second direction D2. Forming the trenches T may include forming a mask pattern (not shown) defining a region in which the fin structure FS will be formed, and anisotropically etching the substrate 100 using the mask pattern as an etch mask.

Device isolation patterns 110 may be formed at both sides of the fin structure FS. The device isolation patterns 110 may be formed to fill the trenches T. Forming the device isolation patterns 110 may include forming an insulating layer filling the trenches T on the substrate 100, and planarizing the insulating layer until the mask pattern is exposed.

Upper portions of the device isolation patterns 110 may be recessed to expose an upper portion of the fin structure FS.

The upper portion of the fin structure FS, which is exposed by the device isolation patterns 110, may be defined as the active fin AF. Recessing the upper portions of the device isolation patterns 110 may be performed using, e.g., a wet etching process and may be performed using an etch recipe having an etch selectivity with respect to the fin structure FS. The mask pattern may be removed while the upper portions of the device isolation patterns 110 are recessed.

A sacrificial gate pattern 130 and an etch stop pattern 120 may be formed on the substrate 100 to intersect the fin structure FS and the device isolation patterns 110. The sacrificial gate pattern 130 may extend in the second direction D2. The sacrificial gate pattern 130 may cover a top surface and sidewalls of the fin structure FS and may extend onto top surfaces of the device isolation patterns 110. The etch stop pattern 120 may extend along a bottom surface of the sacrificial gate pattern 130. The etch stop pattern 120 may be disposed between the sacrificial gate pattern 130 and the fin structure FS and between the sacrificial gate pattern 130 and the device isolation patterns 110.

Forming the sacrificial gate pattern 130 and the etch stop pattern 120 may include sequentially forming an etch stop layer and a sacrificial gate layer on the fin structure FS and the device isolation patterns 110, and successively patterning the sacrificial gate layer and the etch stop layer. The etch stop layer may include, e.g., a silicon oxide layer. The sacrificial gate layer may include a material having an etch selectivity with respect to the etch stop layer. The sacrificial gate layer may include, e.g., a poly-silicon layer. The sacrificial gate layer may be patterned to form the sacrificial gate pattern 130. Pattering the sacrificial gate layer may include performing an etch process having an etch selectivity with respect to the etch stop layer. After the formation of the sacrificial gate pattern 130, the etch stop layer disposed at both sides of the sacrificial gate pattern 130 may be removed to form the etch stop pattern 120 under the sacrificial gate pattern 130.

Since the sacrificial gate pattern 130 is formed to intersect the device isolation patterns 110, the first portion P1 and the second portions P2 may be defined in each of the device isolation patterns 110. The first portion P1 may be a portion of each of the device isolation patterns 110, which is disposed under the sacrificial gate pattern 130 and overlaps with the sacrificial gate pattern 130 in a plan view. The second portions P2 may be other portions of each of the device isolation patterns 110, which are disposed at both sides of the sacrificial gate pattern 130 and are laterally spaced apart from each other with the first portion P1 interposed therebetween.

Figure 5:
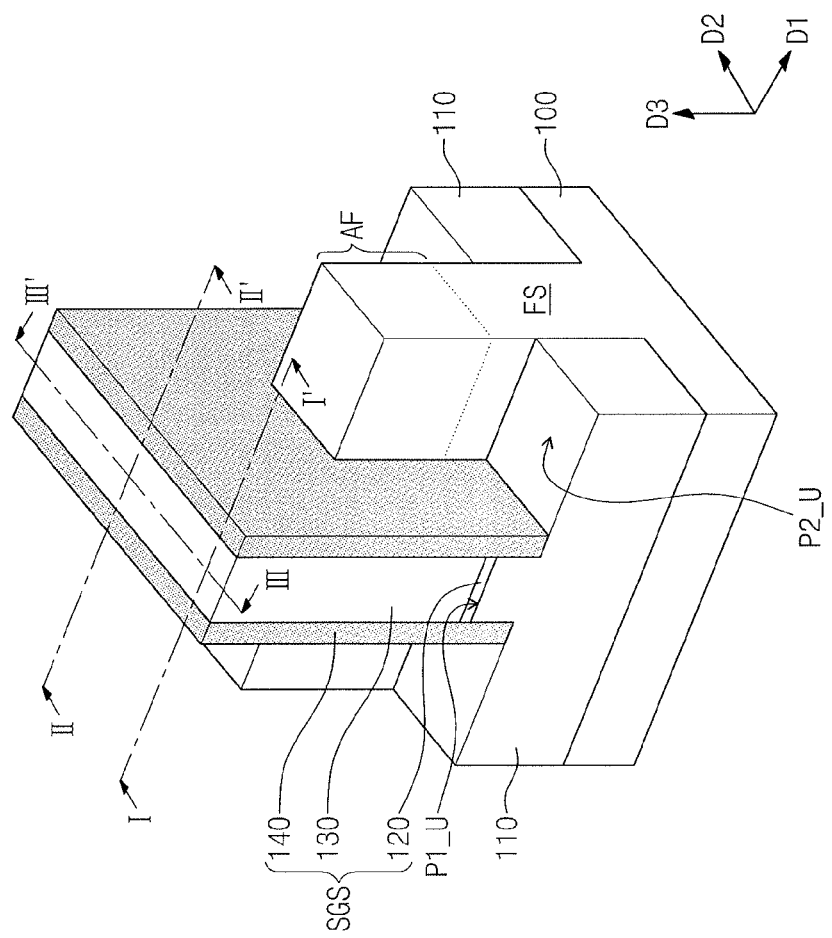
Figure 6:
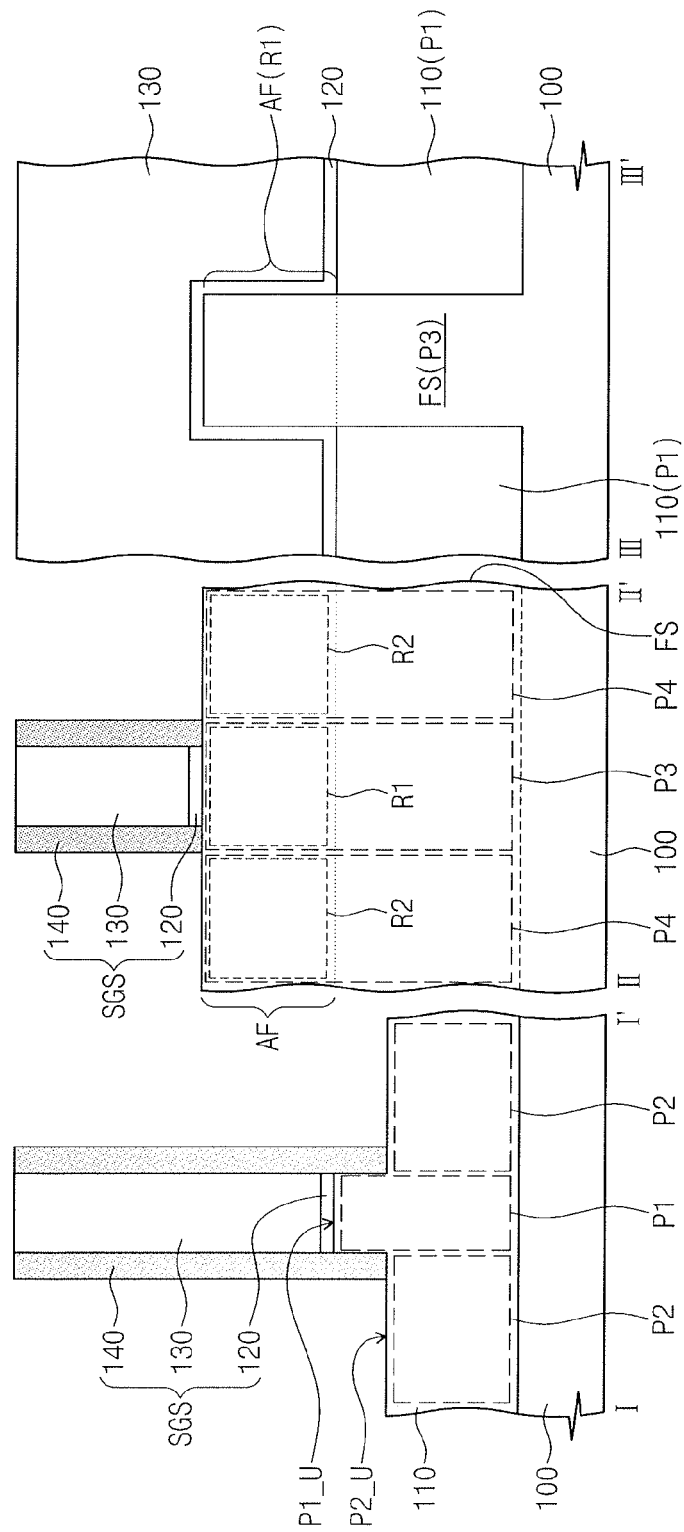

Referring to FIGS. 5 and 6, upper portions of the second portions P2 of each of the device isolation patterns 110 may be recessed, and thus the top surface P1_U of the first portion P1 may be disposed at a higher level than the top surfaces P2_U of the second portions P2. Recessing the upper portions of the second portions P2 may be performed using, e.g., a dry or wet etching process.

For example, according to an embodiment, the top surfaces P2_U of the second portions P2 may be substantially flat by the recessing process, as illustrated in FIG. 6. In another example, according to an embodiment, the top surfaces P2_U of the second portions P2 may be formed to have a concave shape by the recessing process, as illustrated in FIG. 11A. In yet another example, according to an embodiment, the top surfaces P2_U of the second portions P2 may be formed to have a convex shape by the recessing process, as illustrated in FIG. 11B.

After recessing the upper portions of the second portions P2 to have the top surface P1_U of the first portion P1 protrude above the top surfaces P2_U the second portions P2, the gate spacers 140 may be formed on both sidewalls of the sacrificial gate pattern 130, respectively. For example, the gate spacers 140 may include silicon nitride. Forming the gate spacers 140 may include forming a gate spacer layer covering the sacrificial gate pattern 130 on the substrate 100, and anisotropically etching the gate spacer layer to form the gate spacers 140.

The gate spacers 140 may extend onto sidewalls of the first portion P1. Bottom surfaces of the gate spacers 140 may be in contact with the top surfaces P2_U of the second portions P2. Thus, at least a portion of the first portion P1 may be disposed between the gate spacers 140 to overlap a bottom of the sacrificial gate pattern 130. The sacrificial gate pattern 130, the etch stop pattern 120, and the gate spacers 140 may be defined as a sacrificial gate structure SGS.

Since the sacrificial gate structure SGS is formed to intersect the fin structure FS, the third portion P3 and the fourth portions P4 may be defined in the fin structure FS. The third portion P3 may be a portion of the fin structure FS which is disposed under the sacrificial gate structure SGS and overlaps with the sacrificial gate structure SGS in a plan view. The fourth portions P4 may be other portions of the fin structure FS which are disposed at both sides of the sacrificial gate structure SGS and are laterally spaced apart from each other with the third portion P3 interposed therebetween.

In addition, since the sacrificial gate structure SGS intersects the fin structure FS, a first region R1 and second regions R2 may be defined in the active fin AF. The first region R1 may be a region of the active fin AF which is disposed under the sacrificial gate structure SGS and overlaps with the sacrificial gate structure SGS in a plan view. The second regions R2 may be other regions of the active fin AF which are disposed at both sides of the sacrificial gate structure SGS and are laterally separated from each other by the first region R1. The first region R1 of the active fin AF may be an upper region of the third portion P3 of the fin structure FS, and the second regions R2 of the active fin AF may be upper regions of the fourth portions P4 of the fin structure FS, respectively.

Figure 7:
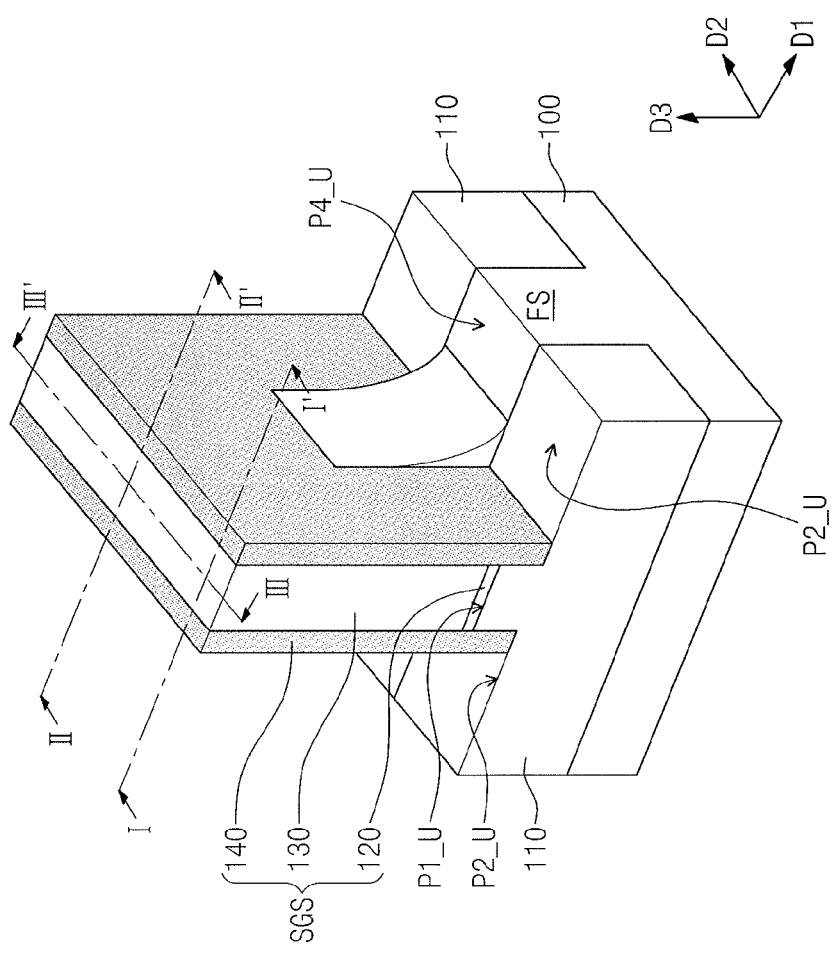
Figure 8:
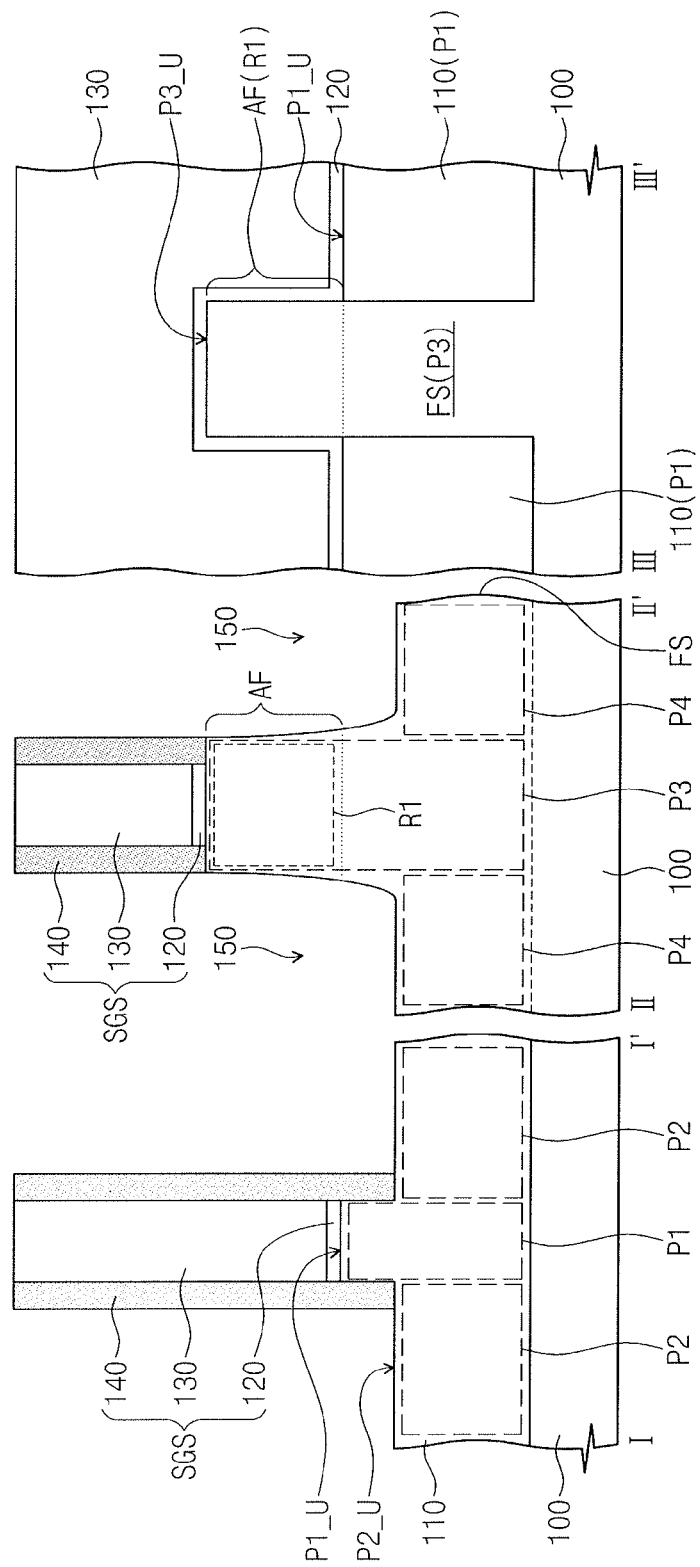

Referring to FIGS. 7 and 8, upper portions of the fourth portions P4 of the fin structure FS may be removed to form recess regions 150 in the fin structure FS. Thus, a top surface P3_U of the third portion P3 may be disposed at a higher level than top surfaces P4_U of the fourth portions P4. Removing the upper portions of the fourth portions P4 may be performed using, e.g., a dry or wet etching process. At least a portion of each of the second regions R2 may be removed by the process of removing the upper portions of the fourth portions P4.

The top surface P3_U of the third portion P3 may be disposed at a higher level than the top surface P1_U of the first portion P1 of each of the device isolation patterns 110. Thus, the third portion P3 of the fin structure FS may have sidewalls exposed by the device isolation patterns 110, and the exposed sidewalls of the third portion P3 may be covered by the sacrificial gate structure SGS. The bottom surfaces of the gate spacers 140 may be in contact with the top surface P3_U and the exposed sidewalls of the third portion P3. The bottom surfaces of the gate spacers 140 may extend onto the second portions P2 of each of the device isolation patterns 110 so as to be in contact with the top surfaces P2_U of the second portions P2.

In an embodiment, the top surfaces P4_U of the fourth portions P4 may be disposed at the substantially same level as the top surfaces P2_U of the second portions P2 of each of the device isolation patterns 110, as illustrated in FIGS. 7 and 8. Alternatively, the top surfaces P4_U of the fourth portions P4 may be disposed at a higher level than the top surfaces P2_U of the second portions P2 of each of the device isolation patterns 110, unlike FIGS. 7 and 8.

Figure 9:
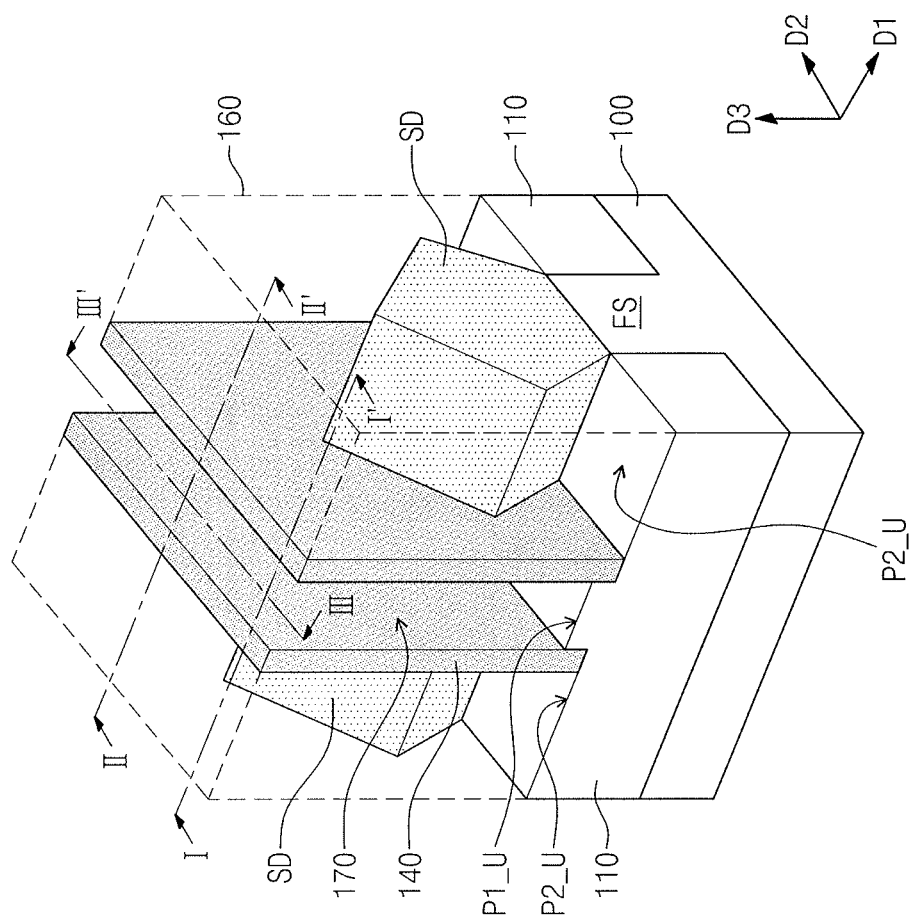
Figure 10:
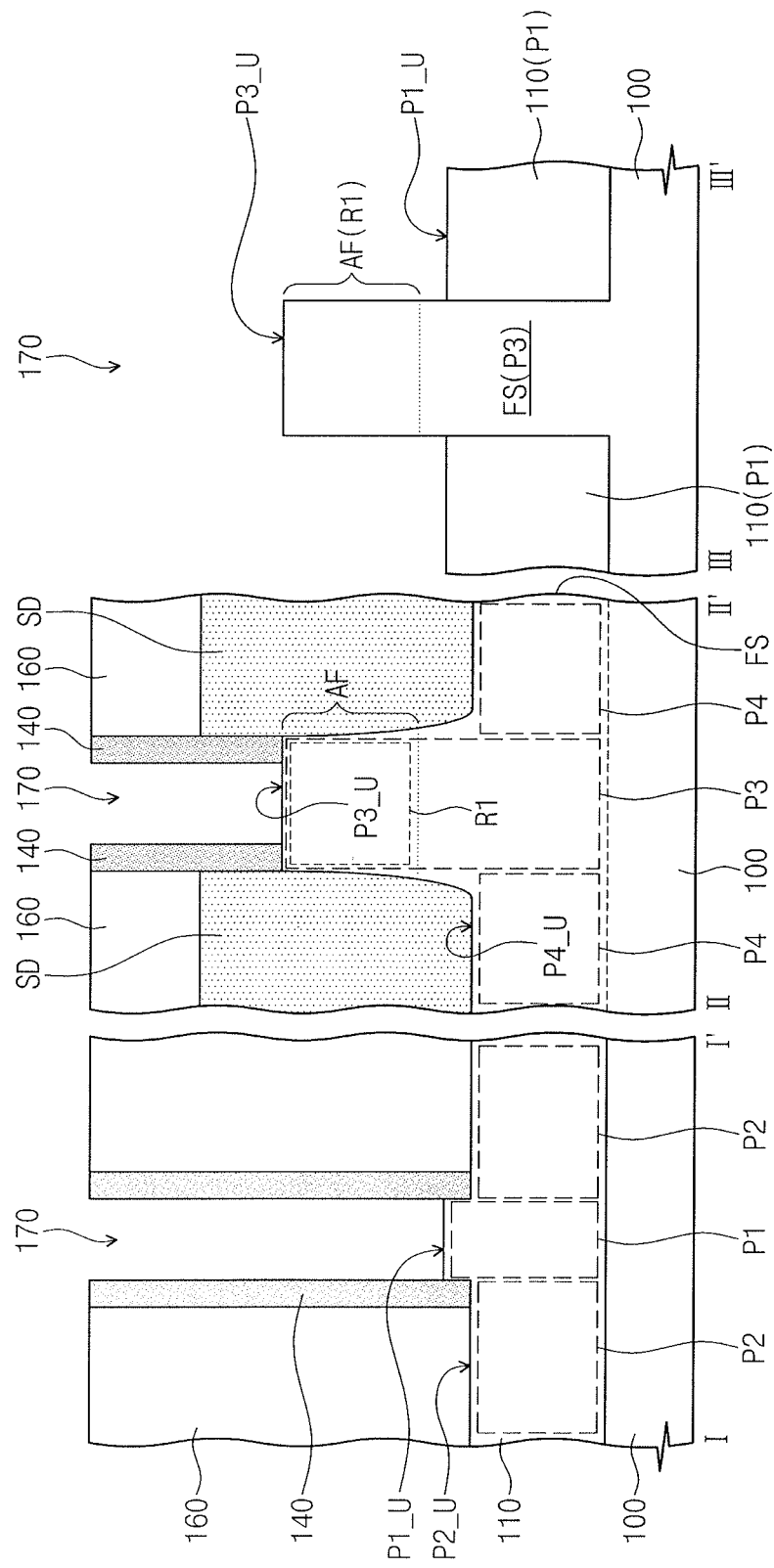
Figure 11A:
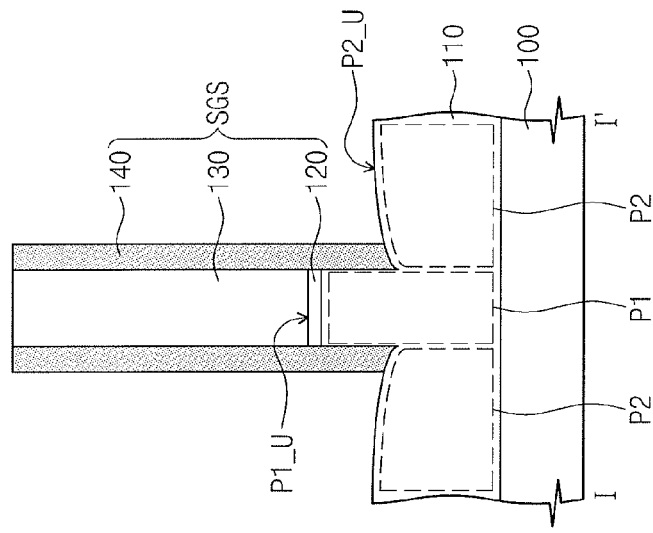
FIGS. 11A and 11B illustrate cross-sectional views corresponding to line I-I' of FIG. 5 to illustrate methods of fabricating a semiconductor device according to some embodiments.
Figure 11B:
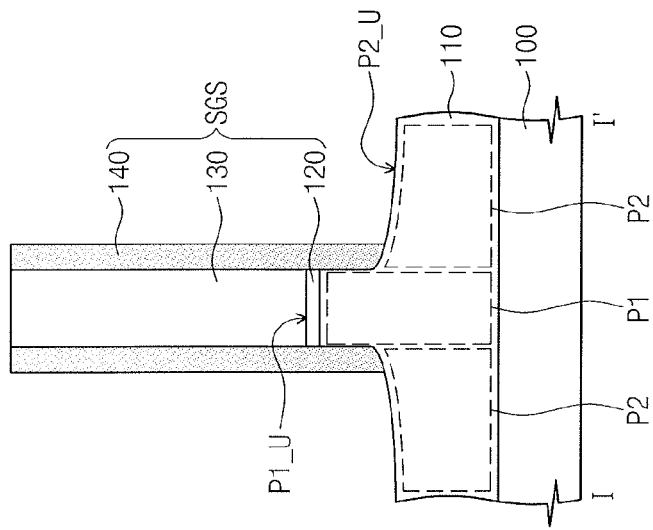

Referring to FIGS. 9 and 10, the source/drain regions SD may be formed at both sides of the sacrificial gate structure SGS. The source/drain regions SD may be formed on the fourth portions P4 of the fin structure FS, respectively. The source/drain regions SD may be formed to fill the recess regions 150, respectively. Forming the source/drain regions SD may include performing a selective epitaxial growth process using surfaces of the fin structure FS exposed through the recess regions 150 as seeds. Each of the source/drain regions SD may include at least one of silicon-germanium (SiGe), silicon (Si), or silicon carbide (SiC), epitaxially grown using the exposed surface of the fin structure FS as the seed.

Forming the source/drain regions SD may further include doping the source/drain regions SD with dopants during or after the selective epitaxial growth process. The dopants may be provided to improve electrical characteristics of a transistor including the source/drain regions SD. If the transistor is an NMOSFET, the dopants may be, e.g., phosphorus (P). If the transistor is a PMOSFET, the dopants may be, e.g., boron (B).

The lower interlayer insulating layer 160 may be formed on the substrate 100 having the source/drain regions SD. The lower interlayer insulating layer 160 may cover the source/drain regions SD and the sacrificial gate structure SGS. The lower interlayer insulating layer 160 may include at least one of e.g., a silicon oxide layer, a silicon nitride layer, a silicon oxynitride layer, or low-k dielectric layers. The lower interlayer insulating layer 160 may be planarized until the sacrificial gate pattern 130 is exposed.

The sacrificial gate pattern 130 and the etch stop pattern 120 may be removed to form a gap region 170 between the gate spacers 140. The gap region 170 may expose the upper portion of the third portion P3 of the fin structure FS.

Forming the gap region 170 may include performing an etching process having an etch selectivity with respect to the gate spacers 140, the lower interlayer insulating layer 160, and the etch stop pattern 120 to etch the sacrificial gate pattern 130. In addition, forming the gap region 170 may further include removing the etch stop pattern 120 to expose the upper portion of the third portion P3 of the fin structure FS. The gap region 170 may expose the top surface P3_U and sidewalls of the third portion P3.

In detail, as illustrated in FIG. 8, the etch stop pattern 120 may cover the top surface P3_U and sidewalls of the third portion P3 of the fin structure FS, as illustrated in FIG. 8. Removing the etch stop pattern 120 may include performing an etching process until the etch stop pattern 120 disposed on the sidewalls of the third portion P3 is exposed.

If the top surface P1_U of the first portion P1 were to be substantially coplanar with the bottom surfaces of the gate spacers 140 (i.e., the top surfaces P2_U of the second portions P2) before the etching process for removing the etch stop pattern 120, the device isolation patterns 110 could be over-etched during the etching process to cause a loss of the device isolation patterns 110. In contrast, according to embodiments, the top surface P1_U of the first portion P1 is disposed at a higher level than the bottom surfaces of the gate spacers 140 (i.e., the top surfaces P2_U of the second portions P2).

In other words, at least a portion of the first portion P1 may be disposed between the gate spacers 140 before the etching process for removing the etch stop pattern 120. In this case, the gate spacers 140 may function as an etch stop layer during the etching process, so the top surface of the first portion P1 may be partially etched. At least a portion of the first portion P1 may remain between the gate spacers 140 after the etching process, and thus it is possible to prevent the device isolation patterns 110 from being over-etched by the etching process. As a result, the loss of the device isolation patterns 110 may be minimized.

For example, in an embodiment, as illustrated in FIG. 10, the top surface P1_U of the first portion P1 may be substantially flat by the etching process for removing the etch stop pattern 120. In another example, in an embodiment illustrated in FIG. 12A, the top surface P1_U of the first portion P1 may be formed to have a concave shape by the etching process. In yet another example, in an embodiment illustrated in FIG. 12B, the top surface P1_U of the first portion P1 may be formed to have a convex shape by the etching process.

Referring again to FIGS. 1 and 2, the gate dielectric pattern GI and the gate electrode GE may be formed to fill the gap region 170. In more detail, a gate dielectric layer may be formed on the substrate 100 having the gap region 170. The gate dielectric layer may partially fill the gap region 170 and may cover the upper portion of the third portion P3 of the fin structure FS. The gate dielectric layer may include at least one of high-k dielectric layers. The gate dielectric layer may include at least one of, but not limited to, a hafnium oxide layer, a hafnium silicate layer, a zirconium oxide layer, or a zirconium silicate layer. The gate dielectric layer may be formed by, e.g., an atomic layer deposition (ALD) process. A gate layer may be formed on the gate dielectric layer to fill the rest of the gap region 170. The gate layer may include at least one of a conductive metal nitride (e.g., titanium nitride or tantalum nitride) or a metal (e.g., aluminum or tungsten). The gate dielectric layer and the gate layer which are sequentially stacked may be planarized to form the gate dielectric pattern GI and the gate electrode GE. Top surfaces of the lower interlayer insulating layer 160 and the gate spacers 140 may be exposed by the planarization process. The gate dielectric pattern GI may extend along a bottom surface of the gate electrode GE and may also extend onto both sidewalls of the gate electrode GE so as to be disposed between the gate electrode GE and the gate spacers 140. The gate dielectric pattern GI and the gate electrode GE may be defined as the gate structure GS.

The upper interlayer insulating layer may be formed on the lower interlayer insulating layer 160. The upper interlayer insulating layer may include an oxide (e.g., silicon oxide), a nitride (e.g., silicon nitride), and/or an oxynitride (e.g., silicon nitride). The first contact holes exposing the source/drain regions SD may be formed to penetrate the upper interlayer insulating layer and the lower interlayer insulating layer 160. Upper portions of the source/drain regions SD may be partially removed by an etching process of forming the first contact holes. A second contact hole exposing the gate electrode GE may be formed to penetrate the upper interlayer insulating layer and the lower interlayer insulating layer 160. Thereafter, first contact plugs may be formed to fill the first contacts holes, respectively, and a second contact plug may be formed to fill the second contact hole. Interconnections may be formed on the upper interlayer insulating layer so as to be connected to the first and second contact plugs. Operating voltages may be applied to the source/drain regions SD and the gate electrode GE through the interconnections and the first and second contact plugs. The first and second contact plugs and the interconnections may include conductive materials.

Figure 13:
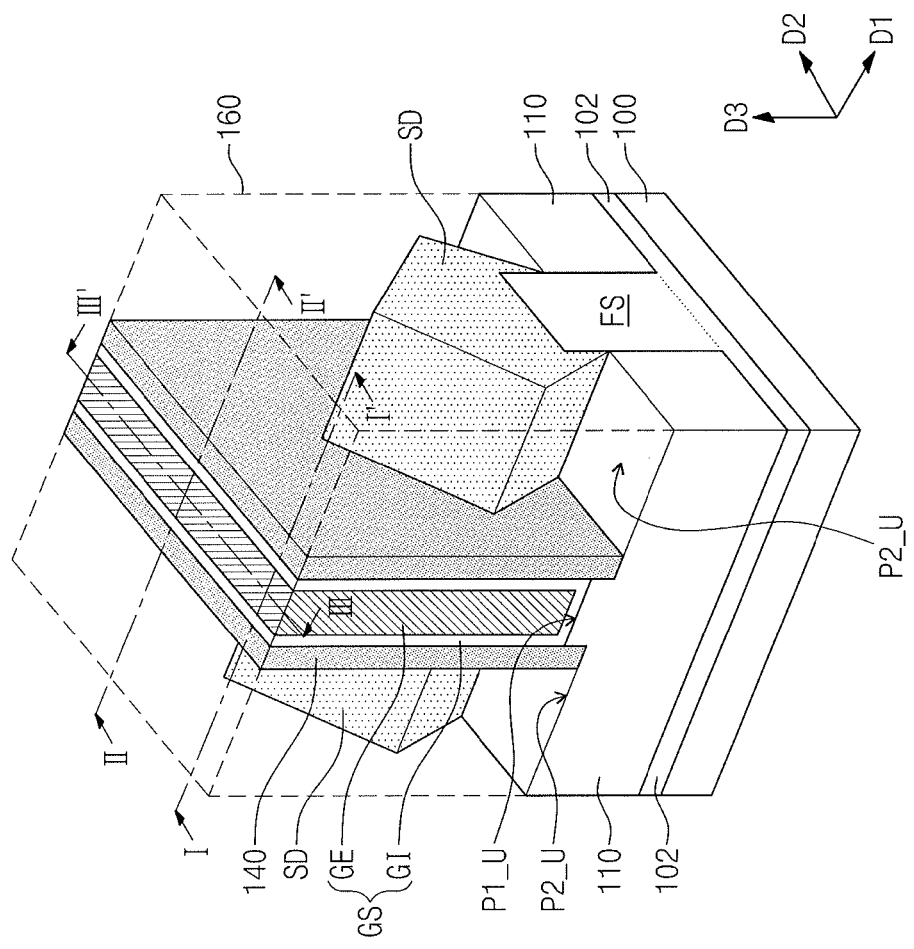
FIG. 13 illustrates a perspective view of a semiconductor device according to an embodiment.
Figure 14:
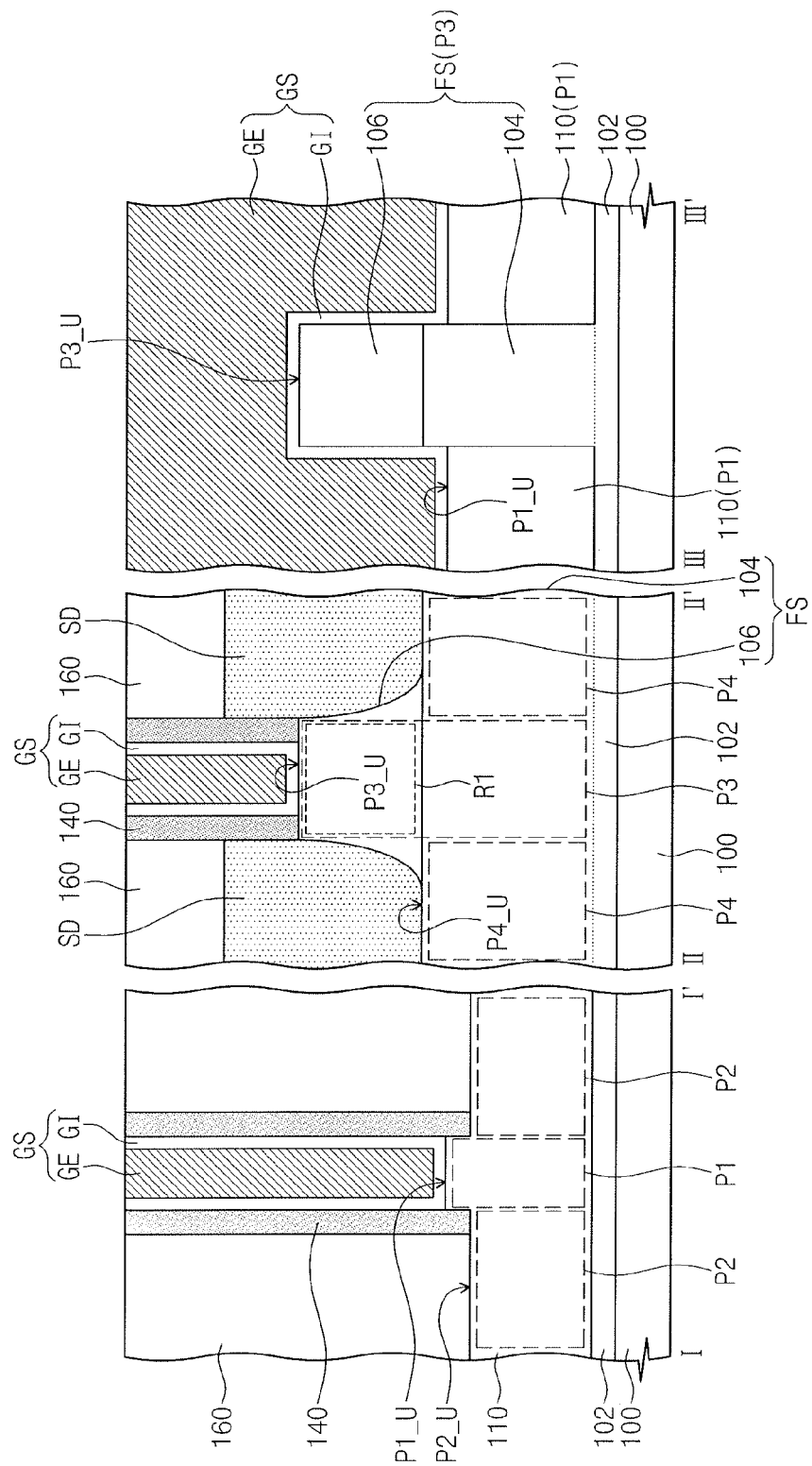
FIG. 14 illustrates a cross-sectional view taken along lines I-I', II-II', and III-III' of FIG. 13.

FIG. 13 is a perspective view illustrating a semiconductor device according to an embodiment, and FIG. 14 is a cross-sectional view taken along lines I-I', II-II', and III-III' of FIG. 13. In the present embodiment, the same elements as described in the embodiment of FIGS. 1 and 2 will be indicated by same reference numerals or same reference designators, and the descriptions of the same elements as in the embodiment of FIGS. 1 and 2 will be omitted or mentioned briefly for the purpose of ease and convenience in explanation.

Referring to FIGS. 13 and 14, a buffer layer 102 may be provided on the substrate 100. The substrate 100 may be a semiconductor substrate. For example, the substrate 100 may be a silicon substrate or a SOI substrate. The buffer layer 102 may include a material of which a lattice constant is different from that of the substrate 100. The lattice constant of the buffer layer 102 may be greater than that of the substrate 100. For example, if the substrate 100 is the silicon substrate, the buffer layer 102 may include silicon-germanium (SiGe).

The fin structure FS extending in the first direction D1 may be provided on the buffer layer 102. The fin structure FS may protrude from the buffer layer 102 in the third direction D3 perpendicular to both the first direction D1 and the second direction D2 intersecting the first direction D1. The first and second directions D1 and D2 may be parallel to a top surface of the substrate 100.

The fin structure FS may include a buffer pattern 104 protruding from the buffer layer 102 in the third direction D3, and an active pattern 106 disposed on the buffer pattern 104. In other words, the buffer pattern 104 may be provided between the buffer layer 102 and the active pattern 106. The buffer pattern 104 may extend in the first direction D1, and the active pattern 106 may be provided on a top surface of the buffer pattern 104.

The buffer pattern 104 may include the same material as the buffer layer 102, and a lattice constant of the buffer pattern 104 may be equal to that of the buffer layer 102. The buffer pattern 104 and the buffer layer 102 may be connected to each other to constitute one, e.g., same, body.

The active pattern 106 may include a material of which a lattice constant is different from that of the buffer pattern 104. In some embodiments, the lattice constant of the active pattern 106 may be greater than that of the buffer pattern 104, so the buffer pattern 104 may provide a compressive stress to the active pattern 106. For example, the active pattern 106 and the buffer pattern 104 may include silicon-germanium (SiGe), and a germanium concentration in the active pattern 106 may be higher than a germanium concentration in the buffer pattern 104. In some embodiments, the lattice constant of the active pattern 106 may be smaller than that of the buffer pattern 104, so the buffer pattern 104 may provide a tensile stress to the active pattern 106. For example, the buffer pattern 104 may include silicon-germanium (SiGe), and the active pattern 106 may include silicon (Si).

Device isolation patterns 110 may be provided at both sides of the fin structure FS. The device isolation patterns 110 may include an oxide (e.g., silicon oxide), a nitride (e.g., silicon nitride), and/or an oxynitride (e.g., silicon oxynitride). The device isolation patterns 110 may be provided on the buffer layer 102 and may extend in the first direction D1. The device isolation patterns 110 may be spaced apart from each other in the second direction D2 with the fin structure FS interposed therebetween.

The device isolation patterns 110 may expose an upper portion of the fin structure FS. Each of the device isolation patterns 110 may expose a portion of a sidewall of the fin structure FS. In other words, the fin structure FS may have the sidewalls exposed by the device isolation patterns 110. At least a portion of the active pattern 106 may be exposed by the device isolation patterns 110. Each of the device isolation patterns 110 may expose at least a portion of a sidewall of the active pattern 106. In other words, the active pattern 106 may have the sidewalls exposed by the device isolation patterns 110.

The gate structure GS may be provided on the substrate 100 to intersect the fin structure FS and the device isolation patterns 110. The gate structure GS may extend in the second direction D2. The gate structure GS may include the gate electrode GE extending in the second direction D2, and the gate dielectric pattern GI disposed between the gate electrode GE and the fin structure FS. The gate dielectric pattern GI may extend between the gate electrode GE and the device isolation patterns 110. Gate spacers 140 may be provided on both sidewalls of the gate structure GS, respectively. The gate dielectric pattern GI may also extend between the gate electrode GE and the gate spacers 140. The active pattern 106 may be provided between the buffer pattern 104 and the gate structure GS. In some embodiments, the active pattern 106 may be locally provided under the gate structure GS and the gate spacers 140.

Each of the device isolation patterns 110 may include the first portion P1 disposed under the gate structure GS, and the second portions P2 disposed at both sides of the gate structure GS. A level of the top surface P1_U of the first portion P1 from the substrate 100 may be higher than a level of the top surfaces P2_U of the second portions P2 from the substrate 100. At least a portion of the first portion P1 may be disposed between the gate spacers 140. A bottom surface of the gate dielectric pattern GI may be in contact with the top surface P1_U of the first portion P1, and bottom surfaces of the gate spacers 140 may be in contact with the top surfaces P2_U of the second portions P2, respectively. Thus, on each of the device isolation patterns 110, the bottom surface of the gate dielectric pattern GI may be disposed at a higher level than the bottom surfaces of the gate spacers 140.

The fin structure FS may include the third portion P3 disposed under the gate structure GS and the gate spacers 140, and the fourth portions P4 disposed at both sides of the gate structure GS. The fourth portions P4 may not overlap with the gate spacers 140 when viewed from a plan view. A level of the top surface P3_U of the third portion P3 from the substrate 100 may be higher than levels of the top surfaces P4_U of the fourth portions P4 from the substrate 100.

A level of the topmost surface of the fin structure FS from the substrate 100 may be higher than a level of the topmost surface of each of the device isolation patterns 110 from the substrate 100. The topmost surface of the fin structure FS may be the top surface P3_U of the third portion P3, and the topmost surface of each of the device isolation patterns 110 may be the top surface P1_U of the first portion P1. In other words, the top surface P3_U of the third portion P3 of the fin structure FS may be disposed at a higher level than the top surface P1_U of the first portion P1 of the device isolation pattern 110.

In some embodiments, the top surfaces P4_U of the fourth portions P4 of the fin structure FS may be disposed at a higher level than the top surfaces P2_U of the second portions P2 of each of the device isolation patterns 110, as illustrated in FIG. 14. Alternatively, the top surfaces P4_U of the fourth portions P4 of the fin structure FS may be substantially coplanar with the top surfaces P2_U of the second portions P2 of each of the device isolation patterns 110, unlike FIG. 14.

The third portion P3 of the fin structure FS may have sidewalls exposed by the device isolation patterns 110. The gate structure GS may cover the top surface P3_U and the exposed sidewalls of the third portion P3 and may extend onto the top surfaces P1_U of the first portions P1 of the device isolation patterns 110. The third portion P3 of the fin structure FS may include the active pattern 106. The active pattern 106 may have sidewalls exposed by the device isolation patterns 110. The gate structure GS may cover the top surface and the exposed sidewalls of the active pattern 106 and may extend onto the top surfaces P1_U of the first portions P1 of the device isolation patterns 110. The top surface of the active pattern 106 may correspond to the top surface P3_U of the third portion P3. The active pattern 106 may function as a channel region of a transistor including the gate structure GS.

The bottom surface of the gate dielectric pattern GI may be in contact with the top surface P3_U and the exposed sidewalls of the third portion P3 of the fin structure FS and may extend onto the first portion P1 of each of the device isolation patterns 110 so as to be in contact with the top surface P1_U of the first portion P1. The bottom surfaces of the gate spacers 140 may be in contact with the top surface P3_U and the exposed sidewalls of the third portion P3 of the fin structure FS and may extend onto the second portions P2 of each of the device isolation patterns 110 so as to be in contact with the top surfaces P2_U of the second portions P2, respectively. Thus, the bottom surface of the gate dielectric pattern GI may be disposed at the substantially same level as the bottom surfaces of the gate spacers 140 on the third portion P3 of the fin structure FS.

Source/drain regions SD may be provided on the fin structure FS at both sides of the gate structure GS, respectively. The source/drain regions SD may be disposed on the fourth portions P4 of the fin structure FS, respectively. The source/drain regions SD may be laterally spaced apart from each other with the active pattern 106 interposed therebetween. Bottom surfaces of the source/drain regions SD may be disposed at a lower level than the top surface of the active pattern 106 (i.e., the top surface P3_U of the third portion P3).

The source/drain regions SD may include epitaxial layers formed using the fin structure FS as a seed. The source/drain regions SD may include at least one of silicon-germanium (SiGe), silicon (Si), or silicon carbide (SiC), which is epitaxially grown using the fin structure FS as the seed. For example, if the semiconductor device according to the inventive concepts includes a CMOS structure, a first epitaxial layer may be formed to be used as source/drain regions of an NMOSFET and a second epitaxial layer may be formed to be used as source/drain regions of a PMOSFET. The first epitaxial layer may be configured to provide a tensile strain to a channel region (i.e., the active pattern 106) of the NMOSFET, and the second epitaxial layer may be configured to provide a compressive strain to a channel region (i.e., the active pattern 106) of the PMOSFET. For example, the first epitaxial layer may be formed of silicon (Si) and/or silicon carbide (SiC), and the second epitaxial layer may be formed of silicon-germanium (SiGe). However, embodiments are not limited thereto.

The source/drain regions SD may further include dopants. The dopants may be provided to improve electrical characteristics of a transistor including the source/drain regions SD. If the transistor is the NMOSFET, the dopants may be, e.g., phosphorus (P). If the transistor is the PMOSFET, the dopants may be, e.g., boron (B).

The lower interlayer insulating layer 160 may be provided on the substrate 100 to cover the gate structure GS and the source/drain regions SD. The upper interlayer insulating layer may be provided on the lower interlayer insulating layer 160. First contact plugs may penetrate the upper interlayer insulating layer and the lower interlayer insulating layer 160 so as to be electrically connected to the source/drain regions SD, and a second contact plug may penetrate the upper interlayer insulating layer and the lower interlayer insulating layer 160 so as to be electrically connected to the gate electrode GE. Interconnections may be disposed on the upper interlayer insulating layer so as to be connected to the first and second contact plugs. Operating voltages may be applied to the source/drain regions SD and the gate electrode GE through the interconnections and the first and second contact plugs.

FIGS. 15, 17, 19, and 21 are perspective views illustrating stages in a method of fabricating a semiconductor device according to an embodiment. FIGS. 16, 18, 20, and 22 are cross-sectional views taken along lines I-I', II-II', and III-III' of FIGS. 15, 17, 19, and 21, respectively. In the present embodiment, the same elements as described in the fabrication embodiment described with reference to FIGS. 3 to 10 will be indicated by the same reference numerals or the same reference designators, and the descriptions to the same elements as in the embodiment of FIGS. 3 to 10 will be omitted or mentioned briefly for the purpose of ease and convenience in explanation.

Figure 15:
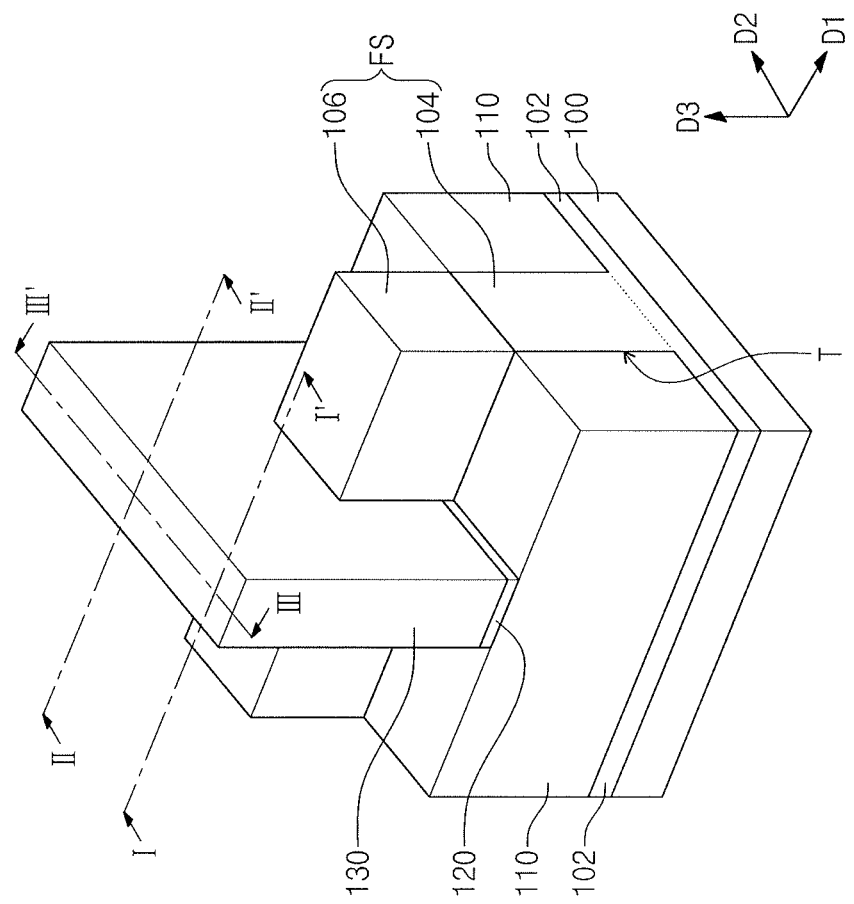
FIGS. 15, 17, 19, and 21 illustrate perspective views of stages in a method of fabricating a semiconductor device according to an embodiment.
Figure 16:
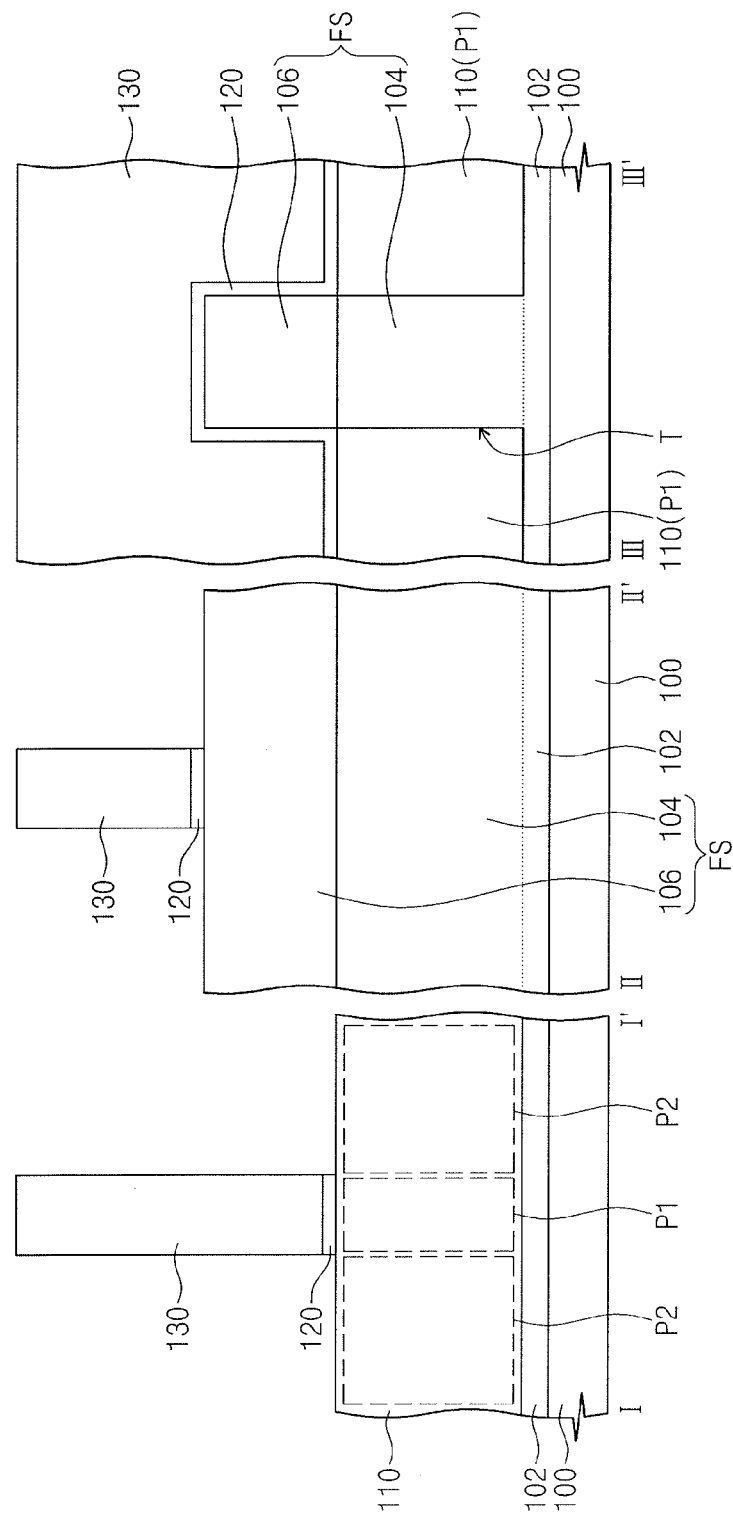
FIGS. 16, 18, 20, and 22 illustrate cross-sectional views taken along lines I-I', II-II', and III-III' of FIGS. 15, 17, 19, and 21, respectively.

Referring to FIGS. 15 and 16, the buffer layer 102 may be formed on the substrate 100, and the fin structure FS extending in the first direction D1 may be formed on the buffer layer 102. The fin structure FS may protrude from the buffer layer 102 and may include the buffer pattern 104 extending in the first direction D1 and the active pattern 106 disposed on the top surface of the buffer pattern 104 to extend in the first direction D1. A preliminary buffer layer and an active layer may be sequentially formed on the substrate 100, and the active layer and the preliminary buffer layer may be patterned to form trenches T defining the fin structure FS. The trenches T may have linear shapes extending in the first direction D1.

The preliminary buffer layer may include a material of which a lattice constant is different from that of the substrate 100. The lattice constant of the preliminary buffer layer may be greater than that of the substrate 100. For example, if the substrate 100 is a silicon substrate, the preliminary buffer layer may include silicon-germanium (SiGe). In an embodiment, the preliminary buffer layer may be formed by a selective epitaxial growth (SEG) process using the substrate 100 as a seed. In an embodiment, the preliminary buffer layer may be formed using a chemical vapor deposition (CVD) method or a molecular beam epitaxy (MBE) method.

The active layer may include a material of which a lattice constant is different from that of the preliminary buffer layer. In an embodiment, the lattice constant of the active layer may be greater than that of the preliminary buffer layer. For example, the active layer and the preliminary buffer layer may include silicon-germanium (SiGe), and a germanium concentration of the active layer may be higher than a germanium concentration of the preliminary buffer layer. Thus, the preliminary buffer layer may provide a compressive stress to the active layer. In an embodiment, the lattice constant of the active layer may be smaller than that of the preliminary buffer layer. For example, the preliminary buffer layer may include silicon-germanium (SiGe), and the active layer may include silicon (Si). Thus, the preliminary buffer layer may provide a tensile stress to the active layer. In an embodiment, the active layer may be formed by a SEG process using the preliminary buffer layer as a seed. In an embodiment, the active layer may be formed by a CVD method or a MBE method.

Forming the trenches T may include forming a mask pattern (not shown) defining the fin structure FS on the active layer, and anisotropically etching the active layer and the preliminary buffer layer using the mask pattern as an etch mask. The active layer may be etched to form the active pattern 106 during the anisotropic etching process, and an upper portion of the preliminary buffer layer may be etched to form the buffer pattern 104 during the anisotropic etching process. A lower portion of the preliminary buffer layer, which is not etched during the anisotropic etching process, may be defined as the buffer layer 102.

Device isolation patterns 110 may be formed at both sides of the fin structure FS, respectively. The device isolation patterns 110 may be formed to fill the trenches T. Forming the device isolation patterns 110 may include forming an insulating layer filling the trenches T on the substrate 100, and planarizing the insulating layer until the mask pattern is exposed.

Upper portions of the device isolation patterns 110 may be recessed to expose an upper portion of the fin structure FS. Since the recessing process is performed, at least a portion of the active pattern 106 may be exposed by the device isolation patterns 110. Recessing the upper portions of the device isolation patterns 110 may be performed using, e.g., a wet etching process and may be performed using an etch recipe having an etch selectivity with respect to the fin structure FS. The mask pattern may be removed while the upper portions of the device isolation patterns 110 are recessed.

The sacrificial gate pattern 130 and an etch stop pattern 120 may be formed on the substrate 100, the fin structure FS, and the device isolation patterns 110. The sacrificial gate pattern 130 and the etch stop pattern 120 may intersect the fin structure FS and the device isolation patterns 110. The sacrificial gate pattern 130 may extend in the second direction D2. The sacrificial gate pattern 130 may cover a top surface and sidewalls of the fin structure FS and may extend onto top surfaces of the device isolation patterns 110. The etch stop pattern 120 may extend along a bottom surface of the sacrificial gate pattern 130. The etch stop pattern 120 may be disposed between the sacrificial gate pattern 130 and the fin structure FS and between the sacrificial gate pattern 130 and each of the device isolation patterns 110. Forming the sacrificial gate pattern 130 and the etch stop pattern 120 may be the substantially same as the fabrication method described with reference to FIGS. 3 and 4.

Since the sacrificial gate pattern 130 intersects the device isolation patterns 110, the first portion P1 and the second portions P2 may be disposed in each of the device isolation patterns 110. The first portion P1 may be a portion of the device isolation pattern 110 which is disposed under the sacrificial gate pattern 130 and overlaps with the sacrificial gate pattern 130 in a plan view. The second portions P2 may be other portions of the device isolation pattern 110 which are disposed at both sides of the sacrificial gate pattern 130 and are laterally separated from each other by the first portion P1.

Figure 17:
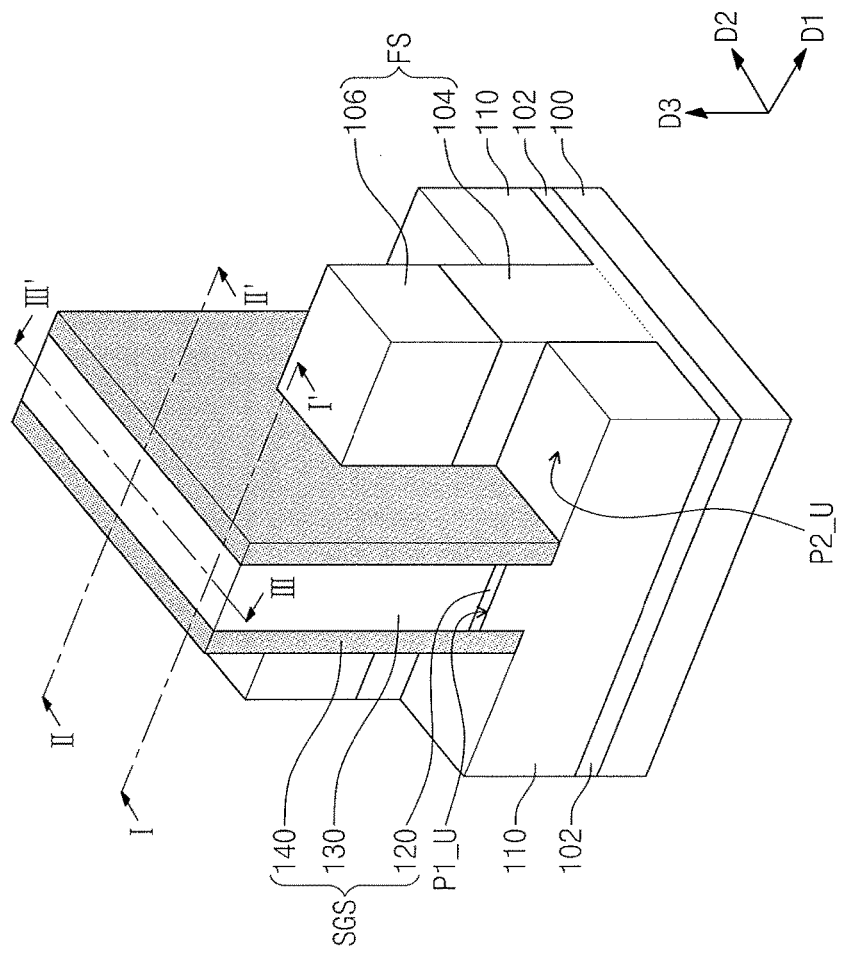
Figure 18:
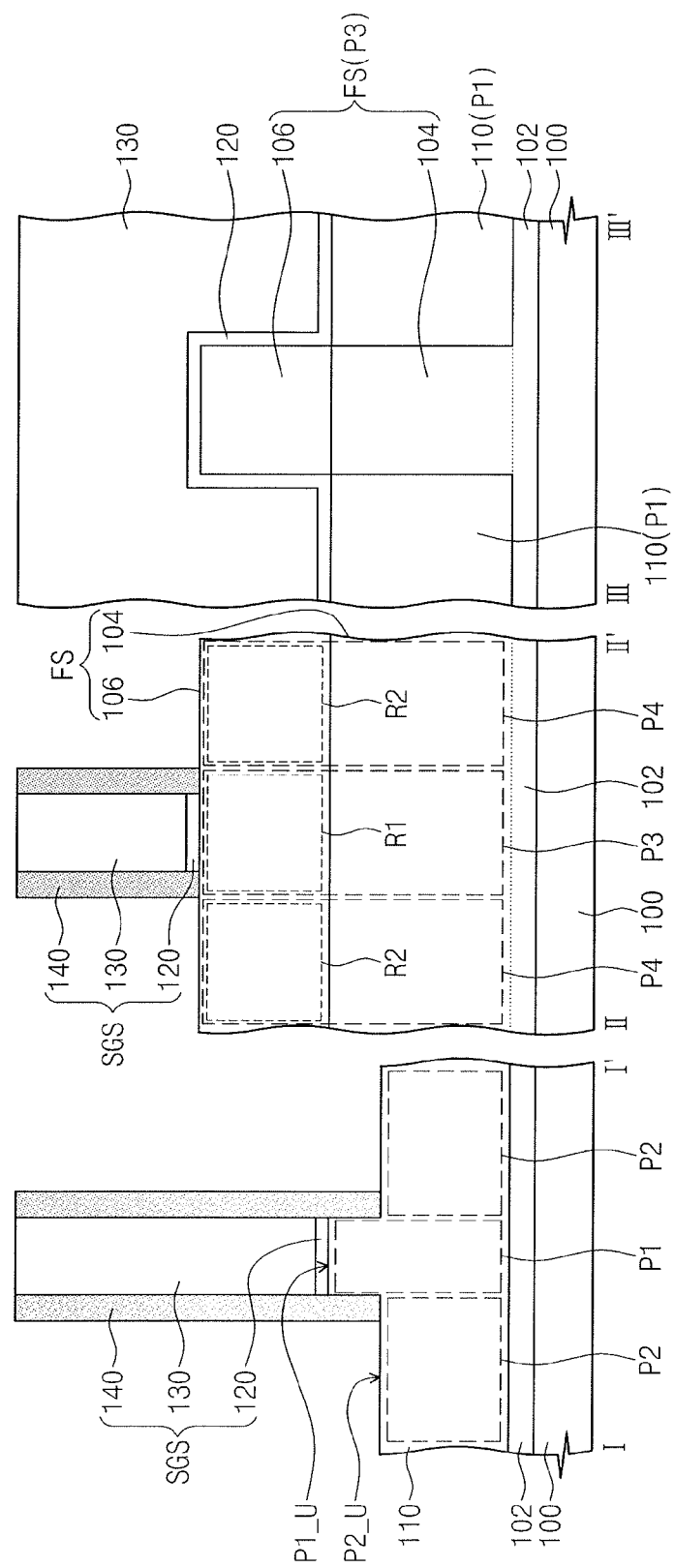

Referring to FIGS. 17 and 18, upper portions of the second portions P2 of each of the device isolation patterns 110 may be recessed. Since the upper portions of the second portions P2 are recessed, the top surface P1_U of the first portion P1 may be higher than the top surfaces P2_U of the second portions P2. Recessing the upper portions of the second portions P2 may be performed using, e.g., a dry or wet etching process.

According to an embodiment, the top surfaces P2_U of the second portions P2 may be substantially flat by the recessing process, as illustrated in FIG. 18. According to an embodiment, the top surfaces P2_U of the second portions P2 may be formed to have a concave shape by the recessing process, as described with reference to FIG. 11A. According to an embodiment, the top surfaces P2_U of the second portions P2 may be formed to have a convex shape by the recessing process, as described with reference to FIG. 11B.

After recessing the upper portions of the second portions P2, gate spacers 140 may be formed on both sidewalls of the sacrificial gate pattern 130, respectively. The gate spacers 140 may include, e.g., silicon nitride. Forming the gate spacers 140 may include forming a gate spacer layer (not shown) covering the sacrificial gate pattern 130 on the substrate 100, and anisotropically etching the gate spacer layer.

The gate spacers 140 may extend onto sidewalls of the first portion P1. Bottom surfaces of the gate spacers 140 may be in contact with the top surfaces P2_U of the second portions P2, so at least a portion of the first portion P1 may be disposed between the gate spacers 140. The sacrificial gate pattern 130, the etch stop pattern 120, and the gate spacers 140 may be defined as a sacrificial gate structure SGS.

Since the sacrificial gate structure SGS is formed to intersect the fin structure FS, the third portion P3 and fourth portions P4 may be defined in the fin structure FS. The third portion P3 may be a portion of the fin structure FS which is disposed under the sacrificial gate structure SGS and overlaps with the sacrificial gate structure SGS in a plan view. The fourth portions P4 may be other portions of the fin structure FS which are disposed at both sides of the sacrificial gate structure SGS and are laterally separated from each other by the third portion P3.

In addition, since the sacrificial gate structure SGS intersects the fin structure FS, the first region R1 and the second regions R2 may be defined in the active pattern 106. The first region R1 may be a region of the active pattern 106 which is disposed under the sacrificial gate structure SGS and overlaps with the sacrificial gate structure SGS in a plan view. The second regions R2 may be other regions of the active pattern 106 which are disposed at both sides of the sacrificial gate structure SGS and are laterally separated from each other by the first region R1. The first region R1 of the active pattern 106 may correspond to an upper region of the third portion P3 of the fin structure FS, and the second regions R2 of the active pattern 106 may correspond to upper regions of the fourth portions P4 of the fin structure FS, respectively.

Figure 19:
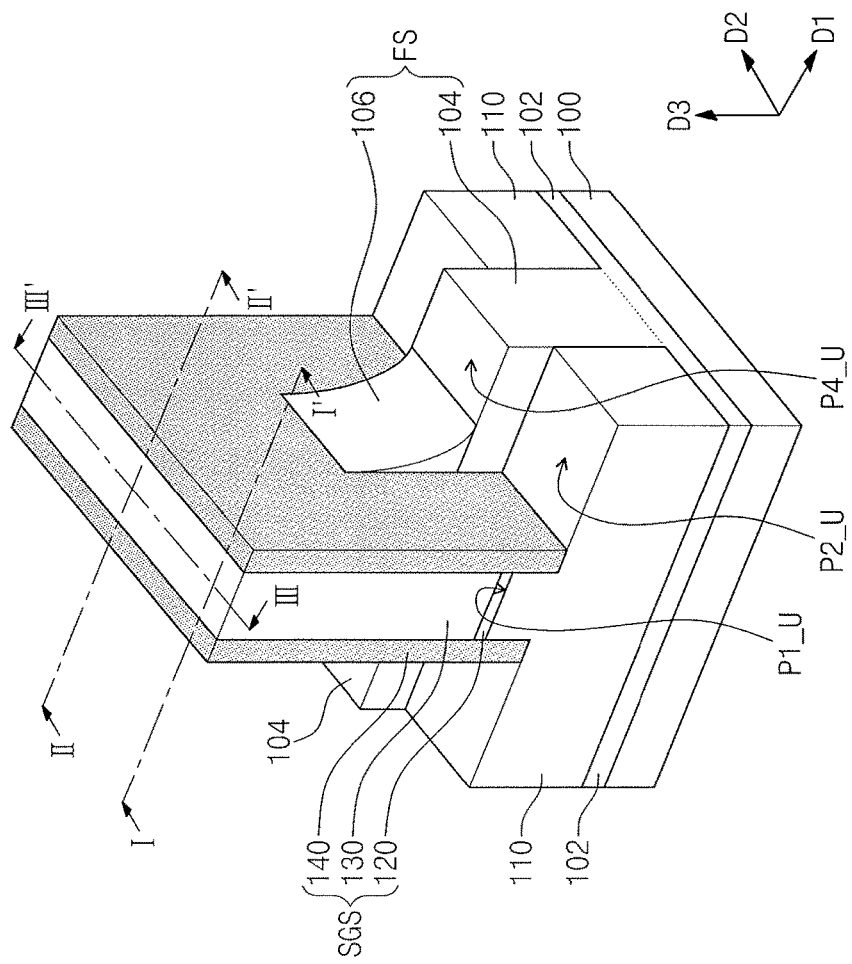
Figure 20:
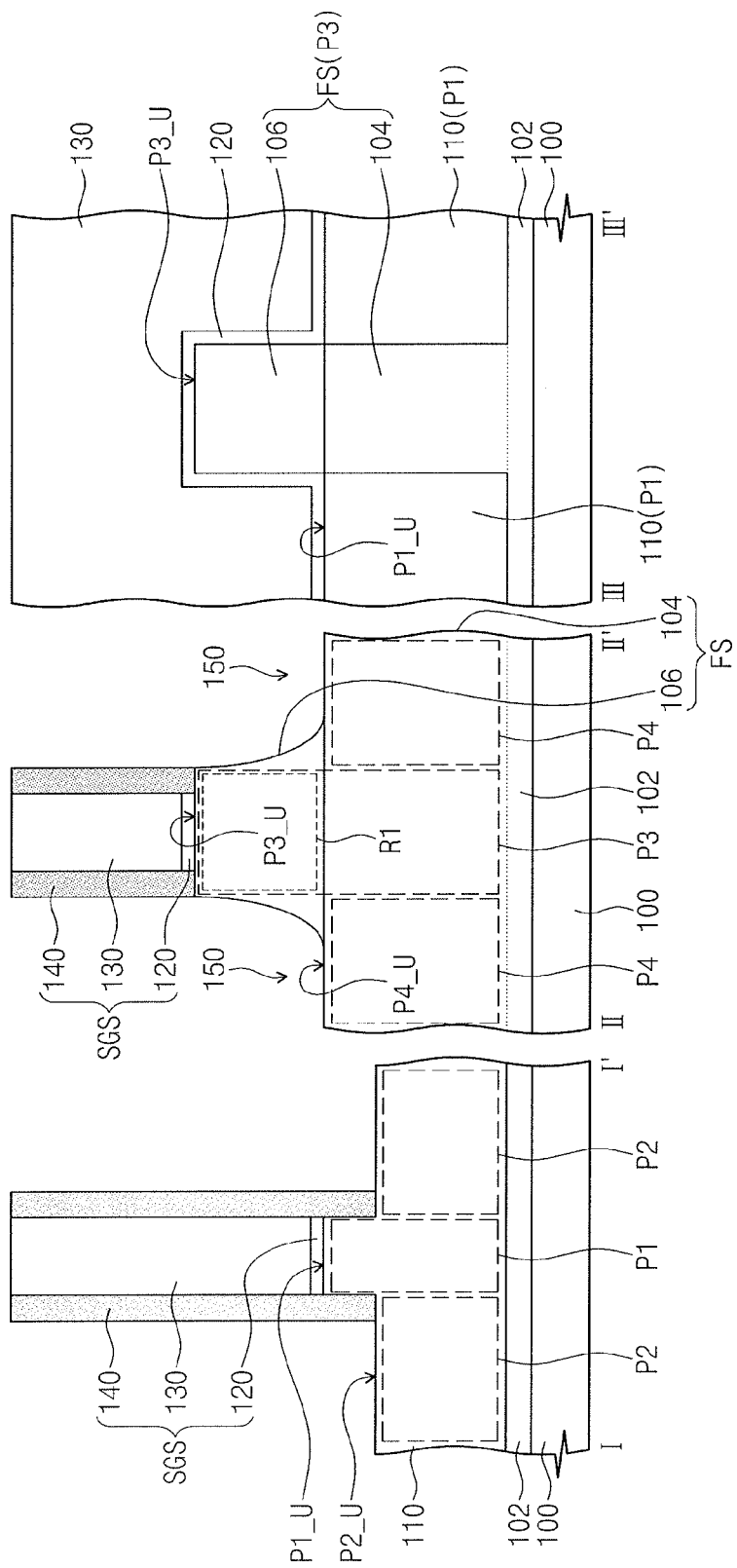

Referring to FIGS. 19 and 20, upper portions of the fourth portions P4 of the fin structure FS may be removed to form recess regions 150 in the fin structure FS. Thus, the top surface P3_U of the third portion P3 may be disposed at a higher level than the top surfaces P4_U of the fourth portions P4. Removing the upper portions of the fourth portions P4 may be performed using, e.g., a dry or wet etching process. At least a portion of each of the second regions R2 of the active pattern 106 may be removed by the process of removing the upper portions of the fourth portions P4.

The top surface P3_U of the third portion P3 may be disposed at a higher level than the top surface P1_U of the first portion P1 of each of the device isolation patterns 110. Thus, the third portion P3 of the fin structure FS may have sidewalls exposed by the device isolation patterns 110, and the exposed sidewalls of the third portion P3 may be covered by the sacrificial gate structure SGS. The bottom surfaces of the gate spacers 140 may be in contact with the top surface P3_U and the exposed sidewalls of the third portion P3 of the fin structure FS. The bottom surfaces of the gate spacers 140 may extend onto the second portions P2 of each of the device isolation patterns 110 so as to be in contact with the top surfaces P2_U of the second portions P2, respectively.

In an embodiment, the top surfaces P4_U of the fourth portions P4 may be disposed at a higher level than the top surfaces P2_U of the second portions P2 of each of the device isolation patterns 110, as illustrated in FIGS. 19 and 20. Alternatively, the top surfaces P4_U of the fourth portions P4 may be disposed at the substantially same level as the top surfaces P2_U of the second portions P2 of each of the device isolation patterns 110, unlike FIGS. 19 and 20.

Figure 21:
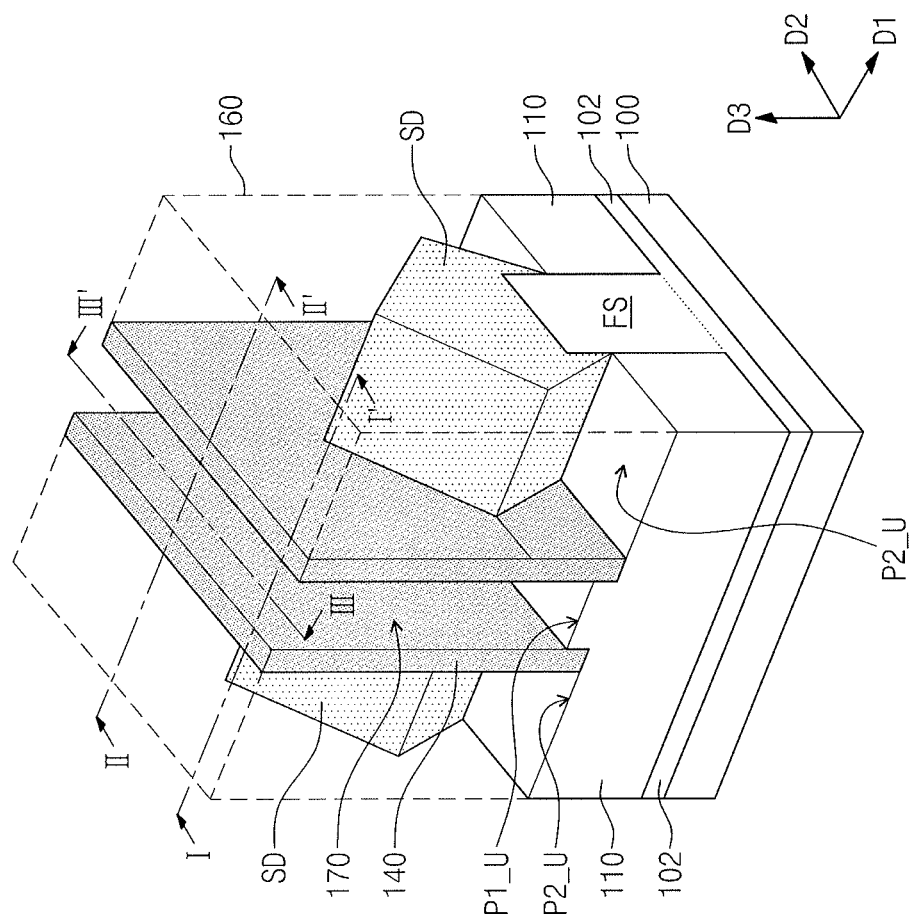
Figure 22:
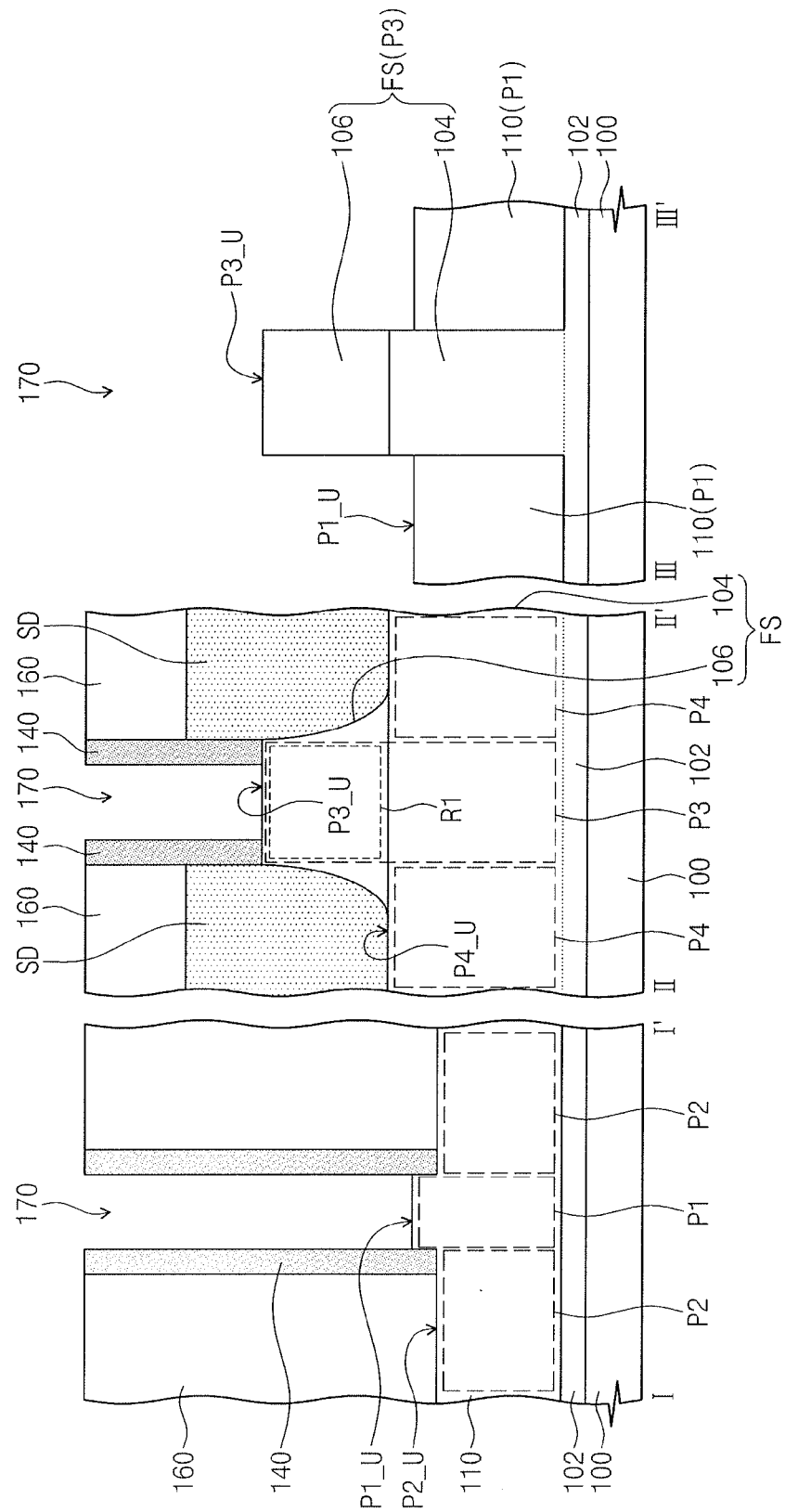

Referring to FIGS. 21 and 22, the source/drain regions SD may be formed at both sides of the sacrificial gate structure SGS. The source/drain regions SD may be formed on the fourth portions P4 of the fin structure FS, respectively. The source/drain regions SD may be formed to fill the recess regions 150, respectively. Forming the source/drain regions SD may include performing a SEG process using surfaces of the fin structure FS exposed through the recess regions 150 as seeds. Each of the source/drain regions SD may include at least one of silicon-germanium (SiGe), silicon (Si), or silicon carbide (SiC), which is grown using the exposed surface of the fin structure FS as the seeds.

Forming the source/drain regions SD may further include doping the source/drain regions SD with dopants during or after the SEG process. The dopants may be provided to improve electrical characteristics of a transistor including the source/drain regions SD. If the transistor is an NMOSFET, the dopants may be, e.g., phosphorus (P). If the transistor is a PMOSFET, the dopants may be, e.g., boron (B).

The lower interlayer insulating layer 160 may be formed on the substrate 100 having the source/drain regions SD. The lower interlayer insulating layer 160 may be formed to cover the source/drain regions SD and the sacrificial gate structure SGS. The lower interlayer insulating layer 160 may be planarized until the sacrificial gate pattern 130 is exposed.

The sacrificial gate pattern 130 and the etch stop pattern 120 may be removed to form the gap region 170 between the gate spacers 140. The gap region 170 may expose the upper portion of the third portion P3 of the fin structure FS.

Forming the gap region 170 may include etching the sacrificial gate pattern 130 by performing an etching process having an etch selectivity with respect to the gate spacers 140, the lower interlayer insulating layer 160 and the etch stop pattern 120. In addition, forming the gap region 170 may further include removing the etch stop pattern 120 to expose the upper portion of the third portion P3 of the fin structure FS. The gap region 170 may expose the top surface P3_U and sidewalls of the third portion P3.

Removing the etch stop pattern 120 may include performing an etching process until the etch stop pattern 120 disposed on the sidewalls of the third portion P3 is removed, as described with reference to FIGS. 9 and 10.

According to embodiments, at least a portion of the first portion P1 of the device isolation pattern 110 may be disposed between the gate spacers 140 before the etching process for removing the etch stop pattern 120. In this case, the gate spacers 140 may function as an etch stop layer during the etching process, so the top surface of the first portion P1 may be partially etched. At least a portion of the first portion P1 may remain between the gate spacers 140 after the etching process, and thus it is possible to prevent the device isolation patterns 110 from being over-etched by the etching process. As a result, the loss of the device isolation patterns 110 may be minimized.

In an embodiment, as illustrated in FIG. 22, the top surface P1_U of the first portion P1 may be formed to be substantially flat by the etching process for removing the etch stop pattern 120. In an embodiment, the top surface P1_U of the first portion P1 may be formed to have a concave shape by the etching process, as described with reference to FIG. 12A. In an embodiment, the top surface P1_U of the first portion P1 may be formed to have a convex shape by the etching process, as described with reference to FIG. 12B.

Referring again to FIGS. 13 and 14, the gate dielectric pattern GI and the gate electrode GE may be formed to fill the gap region 170. The gate dielectric pattern GI and the gate electrode GE may be formed by the substantially same method as described with reference to FIGS. 1 and 2. The gate dielectric pattern GI and the gate electrode GE may be defined as the gate structure GS.

The upper interlayer insulating layer may be formed on the lower interlayer insulating layer 160. First contact holes exposing the source/drain regions SD may be formed to penetrate the upper interlayer insulating layer and the lower interlayer insulating layer 160. Upper portions of the source/drain regions SD may be partially removed by an etching process of forming the first contact holes. A second contact hole exposing the gate electrode GE may be formed to penetrate the upper interlayer insulating layer and the lower interlayer insulating layer 160. Thereafter, first contact plugs may be formed to fill the first contacts holes, respectively, and a second contact plug may be formed to fill the second contact hole. Interconnections may be formed on the upper interlayer insulating layer so as to be connected to the first and second contact plugs. Operating voltages may be applied to the source/drain regions SD and the gate electrode GE through the interconnections and the first and second contact plugs.

According to embodiments, at least a portion of the device isolation patterns 110 may be disposed between the gate spacers 140. Thus, on the device isolation patterns 110, the bottom surfaces of the gate electrode GE and the gate dielectric pattern GI may be higher than the bottom surfaces of the gate spacers 140. In this case, an electrical short between the gate electrode GE and the source/drain regions SD adjacent thereto may be prevented by the device isolation patterns 110. As a result, a semiconductor device with excellent reliability may be realized.

Figure 23:
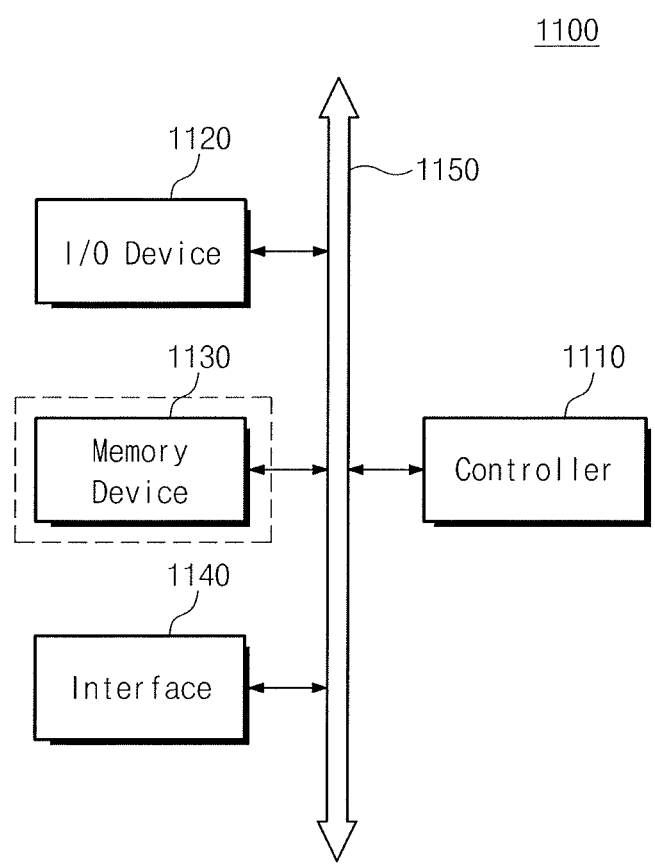
FIG. 23 illustrates a schematic block diagram of an electronic system including a semiconductor device according to embodiments.

FIG. 23 is a schematic block diagram illustrating an electronic system including a semiconductor device according to embodiments.

Referring to FIG. 23, an electronic system 1100 according to an embodiment may include a controller 1110, an input/output (I/O) device 1120, a memory device 1130, an interface unit 1140, and a data bus 1150. At least two of the controller 1110, the I/O device 1120, the memory device 1130, and the interface unit 1140 may communicate with each other through the data bus 1150. The data bus 1150 may correspond to a path through which electrical signals are transmitted.

The controller 1110 may include at least one of, e.g., a microprocessor, a digital signal processor, a microcontroller, or other logic devices having a similar function to any one thereof. The I/O device 1120 may include, e.g., a keypad, a keyboard and/or a display device. The memory device 1130 may store data and/or commands. The memory device 1130 may include a non-volatile memory device (e.g., a flash memory device, a phase-change memory device, and/or a magnetic memory device). In addition, the memory device 1130 may further include a volatile memory device. In an embodiment, the memory device 1130 may include a static random access memory (SRAM) including the semiconductor device according to the above mentioned embodiments. The memory device 1130 may be omitted according to application of the electronic system 1100 or a kind of electronic product implemented with the electrode system 1100. The interface unit 1140 may transmit electrical data to a communication network or may receive electrical data from a communication network. The interface unit 1140 may operate by wireless or cable. For example, the interface unit 1140 may include an antenna or a wireless/cable transceiver. At least one of the semiconductor devices according to the aforementioned embodiments may be provided into at least a portion of the controller 1110 or at least a portion of the I/O device 1120. Although not shown in the drawings, the electronic system 1100 may further include a fast dynamic random access memory (DRAM) device and/or a fast SRAM device which acts as a cache memory for improving an operation of the controller 1110.

Figure 24:
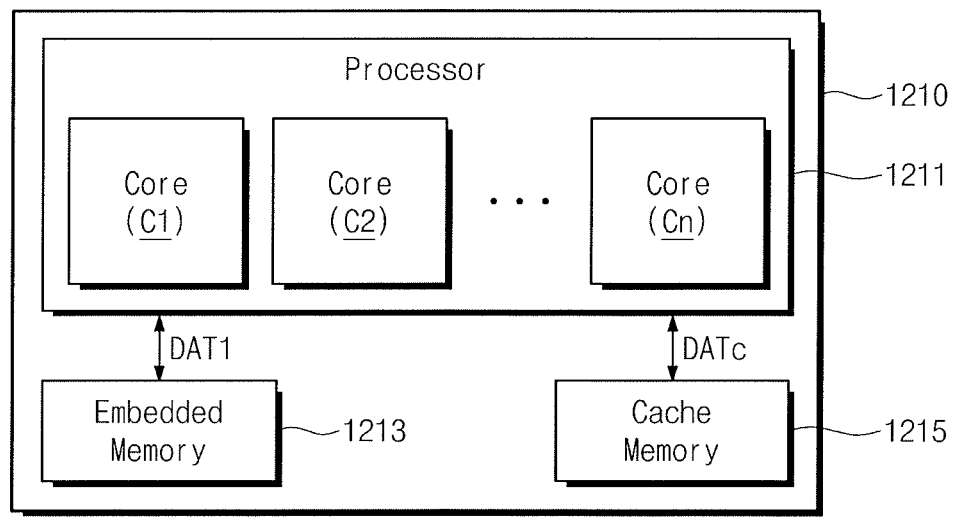
FIG. 24 illustrates a schematic block diagram of an electronic device including a semiconductor device according to embodiments.

FIG. 24 is a schematic block diagram illustrating an electronic device including a semiconductor device according to embodiments.

Referring to FIG. 24, an electronic device 1200 may include a semiconductor chip 1210. The semiconductor chip 1210 may include a processor 1211, an embedded memory 1213, and a cache memory 1215.

The processor 1211 may include one or more processor cores C1 to Cn. The one or more process cores C1 to Cn may process electrical data and/or electrical signals. The process cores C1 to Cn may include at least one of the semiconductor devices according to the above mentioned embodiments.

The electronic device 1200 may perform a specific function using the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or working memory of the processor 1211.

In an embodiment, the electronic device 1200 may be applied to a wearable electronic device. The wearable electronic device may mainly perform a function requiring a relatively small quantity of operations. Thus, when the electronic device 1200 is applied to the wearable electronic device, the embedded memory 1213 may not need a great buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. In an embodiment, the SRAM may include at least one of the semiconductor devices according to the above mentioned embodiments.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. In an embodiment, the cache memory 1215 may include a SRAM including the semiconductor device according to the above mentioned embodiments. When the cache memory 1215 is used in the semiconductor chip 1210, it is possible to reduce an accessing number and an accessing time of the processor 1211 with respect to the embedded memory 1213. Thus, the operating speed of the electronic device 1200 may be improved when the cache memory 1215 is used in the semiconductor chip 1210.

In FIG. 24, the cache memory 1215 is separated from the processor 1211 for the purpose of ease and convenience in explanation. However, the inventive concepts are not limited thereto. In an embodiment, the cache memory 1215 may be configured to be included in the processor 1211.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 25:
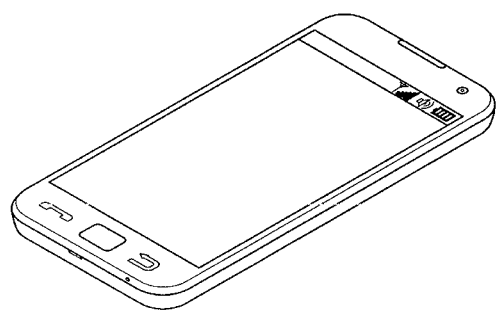
FIGS. 25 through 27 illustrate embodiments of multimedia devices including semiconductor devices according to embodiments.
Figure 26:
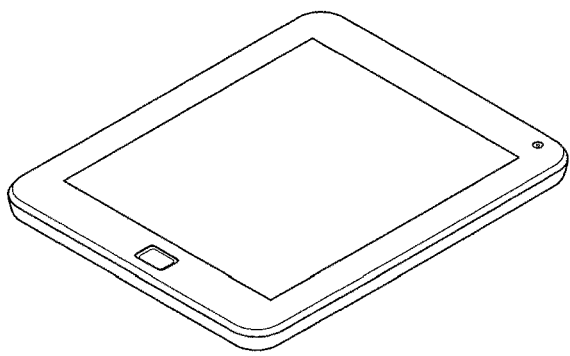
Figure 27:
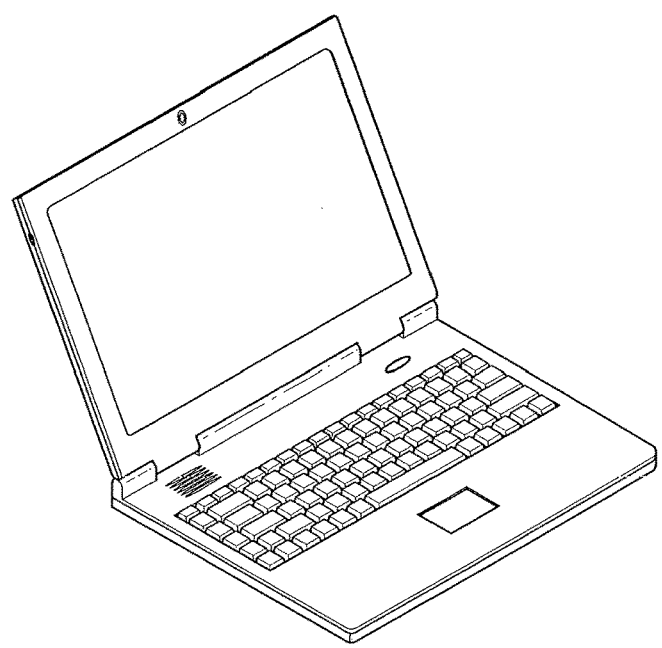

FIGS. 25 to 27 illustrate embodiments of multimedia devices including semiconductor devices according to embodiments of the inventive concepts. The electronic system 1100 of FIG. 23 and/or the electronic device 1200 of FIG. 24 may be applied to a mobile or smart phone 2000 of FIG. 25, a tablet or smart tablet 3000 of FIG. 26, and/or a notebook computer 4000 of FIG. 27.

According to embodiments, at least a portion of the device isolation patterns may be disposed between the gate spacers. Thus, on the device isolation patterns, the bottom surfaces of the gate electrode and the gate dielectric pattern may be higher than the bottom surfaces of the gate spacers. In this case, an electrical short between the gate electrode and the source/drain regions adjacent thereto may be prevented by the device isolation patterns, so the electrical characteristics of the semiconductor device may be improved. As a result, a semiconductor device with excellent reliability may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a fin structure on a substrate;
device isolation patterns on the substrate at opposite sides of the fin structure;
a gate electrode intersecting the fin structure and the device isolation patterns;
a gate dielectric pattern completely separating between the gate electrode and the fin structure and between the gate electrode and the device isolation patterns; and
gate spacers on opposite sidewalls of the gate electrode,
wherein, on each of the device isolation patterns, a bottom surface of the gate dielectric pattern is at a higher level than an entire bottom surface of each gate spacer of the gate spacers that contacts the device isolation pattern,
wherein, on a topmost surface of the fin structure, the bottom surface of the gate dielectric pattern is level with the entire bottom surface of each gate spacer of the gate spacers.

2. The semiconductor device as claimed in claim 1, wherein:
the gate electrode and the gate dielectric pattern define a gate structure, and
each of the device isolation patterns includes:
a first portion under the gate structure, and
second portions at opposite sides of the gate structure, a top surface of the first portion being at a higher level than top surfaces of the second portions.

3. The semiconductor device as claimed in claim 2, wherein at least a portion of the first portion is between the gate spacers.

4. The semiconductor device as claimed in claim 2, wherein the bottom surface of the gate dielectric pattern is in contact with the top surface of the first portion, and the bottom surfaces of the gate spacers are in contact with the top surfaces of the second portions, respectively.

5. The semiconductor device as claimed in claim 4, wherein the gate dielectric pattern extends between the gate electrode and the gate spacers.

6. The semiconductor device as claimed in claim 2, wherein the topmost surface of the fin structure is at a higher level than a topmost surface of each of the device isolation patterns.

7. The semiconductor device as claimed in claim 2, wherein the fin structure includes:
a third portion under the gate structure and the gate spacers; and
fourth portions at opposite sides of the gate structure to be laterally spaced apart from each other with the third portion interposed therebetween,
wherein a top surface of the third portion is at a higher level than top surfaces of the fourth portions,
wherein the top surface of the first portion is at a lower level than the top surface of the third portion, and
wherein source/drain regions are positioned on the fourth portions of the fin structure, respectively.

8. The semiconductor device as claimed in claim 1, wherein, on a topmost surface of the fin structure, the bottom surface of the gate dielectric pattern is level with the bottom surfaces of the gate spacers.

9. A semiconductor device, comprising:
a fin structure on a substrate and extending in a first direction;
device isolation patterns on the substrate at opposite sides of the fin structure, respectively;
a gate electrode on the fin structure and the device isolation patterns, and extending in a second direction intersecting the first direction;
source/drain regions at opposite sides of the gate electrode; and
gate spacers on opposite sidewalls of the gate electrode, respectively, and conformal on top and side surfaces of the fin structure, each gate spacer of the gate spacers being between the gate electrode and a corresponding one of the source/drain regions,
wherein each of the device isolation patterns includes a first portion between portions of facing surfaces of the gate spacers,
wherein the fin structure includes a third portion under the gate electrode and the gate spacers, the third portion being interposed between the source/drain regions, and
wherein a width of a top surface of the third portion in the first direction is greater than a width of a top surface of the first portion in the first direction.

10. The semiconductor device as claimed in claim 9, further comprising:
a gate dielectric pattern between the gate electrode and the fin structure, the gate dielectric pattern extending between the gate electrode and each of the device isolation patterns,
wherein the gate electrode and the gate dielectric pattern define a gate structure,
wherein each of the device isolation patterns further includes
second portions at opposite sides of the gate structure, respectively, and
wherein the top surface of the first portion is at a higher level than top surfaces of the second portions.

11. The semiconductor device as claimed in claim 10, wherein a bottom surface of the gate dielectric pattern is in contact with the top surface of the first portion.

12. The semiconductor device as claimed in claim 11, wherein the gate dielectric pattern extends between the gate electrode and the gate spacers.

13. The semiconductor device as claimed in claim 10, wherein bottom surfaces of the gate spacers are in contact with the top surfaces of the second portions, respectively.

14. The semiconductor device as claimed in claim 10, wherein the fin structure further includes
fourth portions at opposite sides of the gate structure to be laterally spaced apart from each other with the third portion interposed therebetween,
wherein the top surface of the third portion is at a higher level than top surfaces of the fourth portions, and
wherein the top surface of the first portion is at a lower level than the top surface of the third portion.

15. The semiconductor device as claimed in claim 14, wherein the source/drain regions are on the fourth portions of the fin structure, respectively.

16. A semiconductor device, comprising:
a fin structure on a substrate;
device isolation patterns on the substrate at opposite sides of the fin structure;
a gate electrode intersecting the fin structure and the device isolation patterns;
a gate dielectric pattern between the fin structure and the gate electrode; and
gate spacers on opposite sidewalls of the gate electrode, wherein a first portion of each of the device isolation patterns protrudes toward the gate electrode and separates between the gate spacers, wherein the gate dielectric pattern includes an extending portion that vertically extends from the first portion and between the gate electrode and each gate spacer of the gate spacers, and wherein an outer surface of the extending portion is vertically aligned with an outer surface of an upper sidewall of the first portion.

17. The semiconductor device as claimed in claim 16, wherein the gate spacers extend beyond the opposite sidewalls of the gate electrode toward the substrate.

18. The semiconductor device as claimed in claim 16, wherein the gate spacers overlap the sidewalls of the gate electrode and sidewalls of the first portion of each of the device isolation patterns.

19. The semiconductor device as claimed in claim 16, wherein each of device isolation patterns includes:

the first portion only in a region overlapping the gate electrode; and second portions at opposite sides of the first portion, the first portion extending above the second portions into a space between the gate spacers.

20. The semiconductor device as claimed in claim 16, wherein a distance between a bottom of the gate electrode and a bottom of the substrate is larger than a distance between bottoms of the gate spacers and the bottom of the substrate.

* * * * *